(12) United States Patent
Watanabe et al.

(10) Patent No.: US 6,256,875 B1
(45) Date of Patent: Jul. 10, 2001

(54) METHOD FOR MANUFACTURING SEMICONDUCTOR DEVICE

(75) Inventors: Masaki Watanabe; Akiyoshi Sawai; Yoshikazu Narutaki; Tomoaki Hashimoto; Masatoshi Yasunaga; Jun Shibata; Hiroshi Seki; Kazuhiko Kurafuchi, all of Tokyo; Katsunori Asai, Hyogo, all of (JP)

(73) Assignees: Mitsubishi Denki Kabushiki Kaisha, Tokyo; Ryoden Semiconductor System Engineering Corporation, Hyogo, both of (JP)

( * ) Notice: Subject to any disclaimer, the term of this patent is extended or adjusted under 35 U.S.C. 154(b) by 0 days.

(21) Appl. No.: 09/400,912

(22) Filed: Sep. 22, 1999

Related U.S. Application Data

(62) Division of application No. 08/738,935, filed on Oct. 24, 1996, now Pat. No. 6,005,289.

(30) Foreign Application Priority Data

Mar. 28, 1996 (JP) .................................................. 8-074571

(51) Int. Cl.[7] ...................................................... H05K 3/36
(52) U.S. Cl. .............................. 29/830; 29/825; 29/840; 29/852; 361/761; 361/764; 427/97
(58) Field of Search .............................. 29/825, 830, 840, 29/852; 427/97; 174/52.4, 260; 361/761, 762, 763, 764

(56) References Cited

U.S. PATENT DOCUMENTS

| 5,315,072 |   | 5/1994  | Arai et al. ........................ 174/262 |
| 5,352,926 | * | 10/1994 | Andrews .......................... 257/717 |
| 5,490,324 |   | 2/1996  | Newman .......................... 29/830 |
| 5,524,339 | * | 6/1996  | Gorowitz et al. ................. 29/841 |
| 5,622,588 | * | 4/1997  | Weber ............................. 29/830 X |
| 5,814,883 |   | 9/1998  | Sawai et al. ..................... 257/712 |

FOREIGN PATENT DOCUMENTS

| 7099391 | 4/1995  | (JP) . |
| 7202069 | 8/1995  | (JP) . |
| 7263869 | 10/1995 | (JP) . |
| 7273241 | 10/1995 | (JP) . |

* cited by examiner

Primary Examiner—Lee Young
Assistant Examiner—Rick Kiltae Chang
(74) Attorney, Agent, or Firm—Leydig, Voit & Mayer, Ltd.

(57) ABSTRACT

The minimum spacing between wires disposed on a printed circuit board of a printed circuit board ball grid array package is reduced. Wiring layers are narrower than in the prior art because they are not plated and because only one metal layer is plated on the wiring layers. The narrower wiring layers can be formed easily with small spaces between wires.

8 Claims, 41 Drawing Sheets

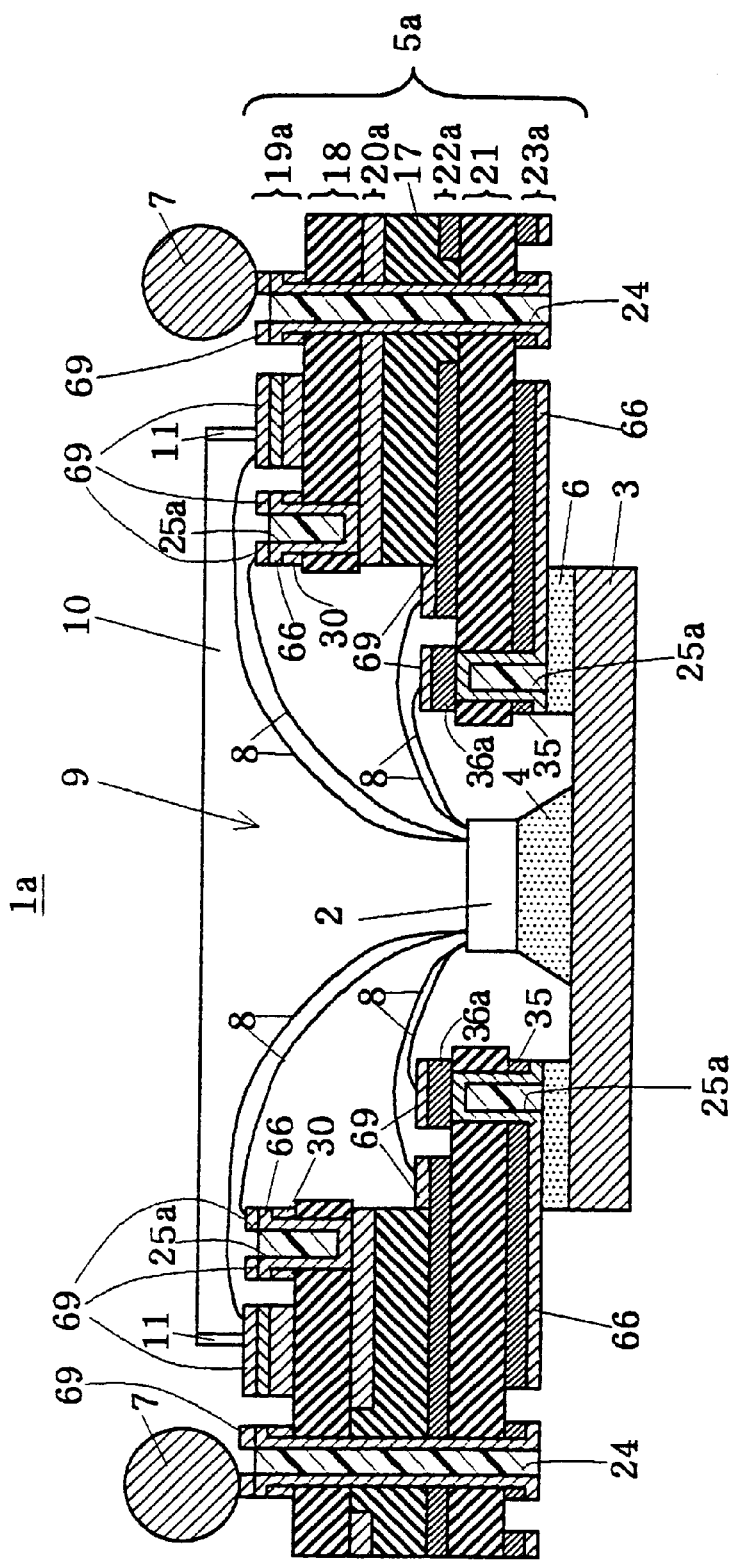

F I G. 1 5
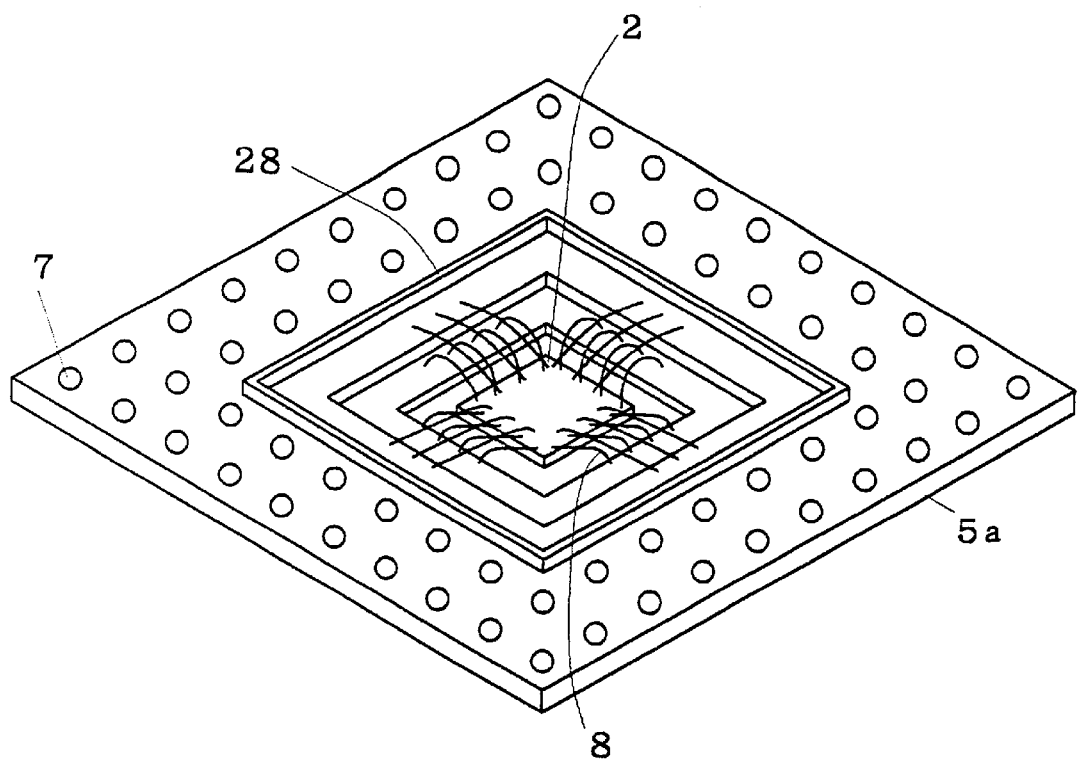

F I G. 5 9
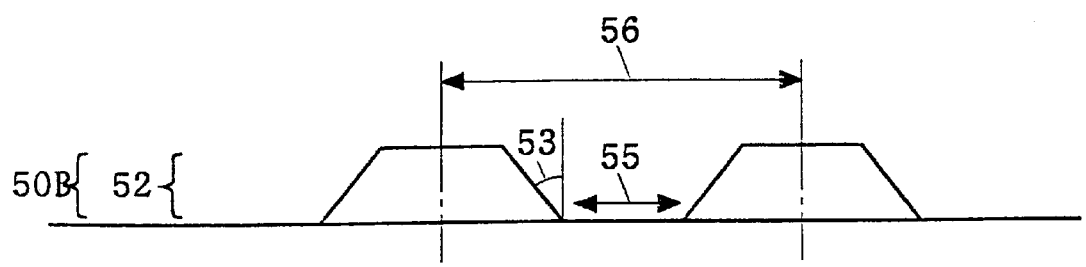

METHOD FOR MANUFACTURING SEMICONDUCTOR DEVICE

This disclosure is a division of patent application Ser. No. 08/738,935, filed on Oct. 24, 1996, now U.S. Pat. No. 6,005,289.

BACKGROUND OF THE INVENTION

1. Field of the Invention

The present invention relates to a method for manufacturing a semiconductor device comprising a printed circuit board type ball grid array (hereinafter referred to as a BGA) and a package for the semiconductor device and, more particularly, to a method for manufacturing a semiconductor device comprising a printed circuit board type BGA package in which a plurality of printed wiring boards are laminated, and a package for the semiconductor device.

2. Description of the Background Art

FIG. 57 is a sectional view showing the structure of a semiconductor device according to the prior art. In FIG. 57, the reference numeral 1 designates a semiconductor device comprising a printed circuit board type BGA package, the reference numeral 2 designates a chip provided in the semiconductor device 1, the reference numeral 3 designates a slug on which the chip 2 is placed, the reference numeral 4 designates a die bonding resin which bonds the chip 2 to the slug 3, the reference numeral 5 designates a frame that is provided around the chip 2 and has one of main surfaces to which the slug 3 is bonded, the reference numeral 6 designates an adhesive bonding the frame 5 to the slug 3, the reference numeral 7 designates a solder ball formed on the other main surface of the frame 5, the reference numeral 8 designates a wire electrically connecting the chip 2 to the frame 5, the reference numeral 9 designates a cavity formed in the central portion of the frame 5 to housing the chip 2 therein, the reference numeral 10 designates a sealing resin for filling in the cavity 9 to seal the chip 2, and the reference numeral 11 designates a dam which is formed on the other main surface of the frame 5 enclosing an opening and preventing the sealing resin 10 from flowing out.

The frame 5 comprises two double-sided printed circuit boards 15 and 16 which are laminated, and a prepreg 17 for bonding them. The double-sided printed circuit board 15 has wiring layers 19 and 20 provided on both sides of an insulating substrate 18. The double-sided printed circuit board 16 has wiring layers 22 and 23 provided on both sides of an insulating substrate 21.

The wiring layers 19 and 20 and the wiring layers 22 and 23 provided on both sides of the double-sided printed circuit boards 15 and 16 are wired by interstitial via holes, respectively. The double-sided printed circuit boards 15 and 16 are wired by a through hole 24.

The exchange of a signal and power between the chip 2 and a board on which the semiconductor device 1 is placed occurs through the wire 8, the wiring layers 19, 20, 22 and 23, the through hole 24, an interstitial via hole 25, the solder ball 7 and the like.

A method for manufacturing the printed circuit board type BGA package according to the prior art shown in FIG. 57 will be described below with reference to FIGS. 43 to 57.

First of all, a double-sided printed circuit board 15 having copper foils 30 and 31 laminated on both sides is prepared (see FIG. 43).

Then, a hole 32 for an interstitial via hole which penetrates the double-sided printed circuit board 15 is formed (see FIG. 44). The double-sided printed circuit board 15 on which the hole 32 is formed is plated with copper so that a copper plated layer 33 is formed. Thus, an interstitial via hole 25 is formed (see FIG. 45). As shown in FIG. 46, the interstitial via hole 25 is filled with a resin 34. Consequently, no gap which penetrates the double-sided printed circuit board 15 is present. Then, a wiring layer 20 of the double-sided printed circuit board 15 is patterned (see FIG. 47).

After performing the same steps as the steps shown in FIGS. 43 to 47, a double-sided printed circuit board 16 is prepared in which the interstitial via hole 25 that is filled with the resin 34 is formed and a wiring layer 22 is patterned (see FIG. 48). The double-sided printed circuit board 16 comprises copper foils 35 and 36, and a copper plated layer 37 formed thereon.

Then, the double-sided printed circuit board 15 shown in FIG. 47 and the double-sided printed circuit board 16 shown in FIG. 48 are bonded together by prepreg 17. Consequently, a laminated printed circuit board 38 is formed as an aggregate of the double-sided printed circuit boards 15 and 16 (see FIG. 49). A chamber 39 for forming a cavity 9 shown in FIG. 57 is provided between the double-sided printed circuit boards 15 and 16 in the central portion of the laminated printed circuit board 38. A hole 40 which penetrates the laminated printed circuit board 38 is formed in a region 41 of the laminated printed circuit board 38 where the prepreg 17 is inserted (see FIG. 50). The laminated printed circuit board 38 in which the hole 40 is formed is plated with copper so that a copper plated layer 42 is formed. Thus, a through hole 24 is formed (see FIG. 51). The laminated printed circuit board 38 is immersed in a plating solution so as to be plated with copper. However, the interstitial via hole 25 has been filled with a resin so that the chamber 39 has been sealed. For this reason, the plating solution does not invade the chamber 39.

Subsequently, the through hole 24 is filled with a resin 43 as shown in FIG. 52. Then, a wiring layer 19 is patterned (see FIG. 53). At the same time, the copper foil 30 and the copper plated layers 33 and 42 of the wiring layer 19 which are provided in an upper region 44 of the chamber 39 are removed. An insulating substrate 18 provided in the upper region 44 is opened by a router so that an opening 45 is formed. After that, nickel-gold plating is performed so that a nickel-gold plated layer 46 is formed on the copper plated layers 37 and 42 (see FIG. 54).

As shown in FIG. 55, a wiring layer 23 is patterned. At the same time, the copper foil 35 and the copper plated layers 37 and 42 which are provided in a lower region 47 of the chamber 39 are removed. As shown in FIG. 56, an opening 48 is formed in the lower region 47 so that a frame 5 is completed. A slug 3 is bonded to the frame 5 with an adhesive 6.

The chip 2 is bonded to the slug 3 with a die bonding resin 4 and the chip 2 is connected to the nickel-gold plated layer 46 by a wire 8. After a dam 11 is put in place, the cavity 9 is filled with a sealing resin 10 so that a package is sealed. Then, a solder ball 7 is formed on the nickel-gold plated layer 46 of the wiring layer 19. Thus, the printed circuit board type BGA package is completed (see FIG. 57).

The semiconductor device and the method for manufacturing the semiconductor device according to the prior art have the above-mentioned structure. Therefore, the copper plated layers 33 and 37 are formed on the copper foils 31 and 36 of the wiring layers 20 and 22, and the copper plated layer 33 or 37 and the copper plated layer 42 are formed doubly on the copper foils 30 and 37 of the wiring layers 19 and 23.

Consequently, the thicknesses of the wiring layers 19, 20, 22 and 23 become greater. For this reason, it is hard to reduce the pitches of patterns formed on the wiring layers 19, 20, 22 and 23.

The above-mentioned problem will be described below with reference to FIGS. 58 and 59. FIG. 58 is a sectional view showing the state in which a wiring layer 50A is formed by a copper foil 52 and a copper plated layer 51 and a pattern is formed at a minimum pitch. The formed pattern has a predetermined inclination 53 which depends on the conditions of patterning. In FIG. 58, the reference numeral 55 designates a space between patterns which is required at the minimum, and the reference numeral 54 designates a pattern pitch. FIG. 59 is a sectional view showing the state in which a wiring layer 50B is formed by only the copper foil 52 and a pattern is formed at a minimum pitch. Similarly to the section of the pattern shown in FIG. 58, the pattern shown in FIG. 59 has a predetermined inclination 53 which depends on the conditions of patterning. In FIG. 59, the reference numeral 55 designates a space between patterns which is required at the minimum, and the reference numeral 56 designates a pattern pitch. As seen from a comparison between FIGS. 58 and 59, the pitch 54 is greater than the pitch 56. When the thickness of the wiring layer is increased, it becomes harder to reduce the pitch of the wiring pattern.

Furthermore, the through hole 24 and the interstitial via hole 5 should be plated separately at the plating step. Consequently, the number of manufacturing steps is increased.

In addition, it is necessary to immerse the laminated printed circuit board 38 in the plating solution when forming the through hole 24 at the manufacturing steps. For this reason, a step of filling the interstitial via hole 25 with the resin cannot be omitted.

SUMMARY OF THE INVENTION

A first aspect of the present invention is directed to a method for manufacturing a semiconductor device, comprising the steps of preparing a first printed circuit board having an insulating substrate, a first metallic foil formed on a first main surface of the insulating substrate, a second metallic foil formed on a second main surface of the insulating substrate, and a first hole formed thereon, the first hole penetrating the first metallic foil to reach the second metallic foil and being covered with the second metallic foil, patterning the second metallic foil with a region covering the first hole left, bonding a predetermined member to the second main surface of the insulating substrate so as to form a chamber which faces the region covering the first hole and is sealed, plating the first hole to form a first conductive path for connecting the first and second metallic foils, and forming openings which reach the chamber for an aggregate including the first printed circuit board and the predetermined member after the step of forming the first conductive path.

A second aspect of the present invention is directed to the method for manufacturing a semiconductor device according to the first aspect of the present invention, wherein the step of preparing the first printed circuit board comprises the steps of forming the first metallic foil on the first main surface of the insulating substrate, forming the first hole which penetrates the insulating substrate and the first metallic foil, and laminating the second metallic foil on the second main surface of the insulating substrate.

A third aspect of the present invention is directed to the method for manufacturing a semiconductor device according to the first aspect of the present invention, wherein the step of preparing the first printed circuit board comprises the steps of preparing the insulating substrate having the first and second metallic foils provided on the first and second main surfaces thereof respectively, patterning the first metallic foil in a region where the first hole should be formed, and irradiating laser beams from the patterned first metallic foil side.

A fourth aspect of the present invention is directed to the method for manufacturing a semiconductor device according to the first, second or third aspect of the present invention, wherein the predetermined member includes a laminated product having a first main surface bonded to the second main surface of the insulating substrate, a second main surface and a third metallic foil formed on the second main surface, further comprising the step of forming a second hole which penetrates a portion from the third metallic foil to the first metallic foil before the step of forming the first conductive path, and wherein a second conductive path for connecting the third metallic foil to the first metallic foil is simultaneously formed at the step of forming the first conductive path.

A fifth aspect of the present invention is directed to the method for manufacturing a semiconductor device according to the fourth aspect of the present invention, wherein the laminated product includes a second printed circuit board having a first main surface on which the third metallic foil is formed, a second main surface, and a fourth metallic foil which is formed on the second main surface, further comprising the step of forming a third hole which penetrates the third metallic foil to reach the fourth metallic foil and is covered with the fourth metallic foil for the first printed circuit board before the step of forming the first conductive path.

A sixth aspect of the present invention is directed to the method for manufacturing a semiconductor device according to the fourth aspect of the present invention, wherein the laminated product is formed through the steps of preparing an insulating base having the third metallic foil on a first main surface of the insulating base and a concave portion on a second main surface of the insulating bace, and a second printed circuit board having a fourth metallic foil on a first main surface of the second printed circuit board, a fifth metallic foil on a second main surface of the second printed circuit board, and a third hole formed on the second printed circuit board, the third hole penetrating the fourth metallic foil to reach the fifth metallic foil and being covered with the fifth metallic foil, patterning the fifth metallic foil with a region covering the third hole left, bonding the second main surface of the insulating base to the second main surface of the second printed circuit board, and plating the third hole to form a third conductive path for connecting the fourth and fifth metallic foils.

A seventh aspect of the present invention is directed to the method for manufacturing a semiconductor device according to any of the first to sixth aspects of the present invention, wherein the first hole includes a slit-shaped hole.

An eighth aspect of the present invention is directed to the method for manufacturing a semiconductor device according to the seventh aspect of the present invention, wherein the step of forming the opening comprises the steps of scraping off the inner wall of the slit-shaped hole with the outer wall of the slit-shaped hole left so as to expose the bottom section of the slit-shaped hole, scraping off the upper portion of the outer wall of the slit-shaped hole by spot-facing, and forming a pad on the bottom of the slit-shaped hole.

A ninth aspect of the present invention is directed to a package for a semiconductor device having a plurality of double-sided printed circuit boards laminated such that a portion where a cavity for placing a semiconductor chip on the package should be formed is hollow, at least one of the double-sided printed circuit boards comprising an insulating substrate having first and second main surfaces, and a through hole which penetrates a portion from the first main surface to the second main surface, a first metallic foil which is provided on the first main surface of the insulating substrate and has an opening conforming to the through hole, a second metallic foil which is provided on the second main surface of the insulating substrate and has a region that covers the through hole, and a metallic wire which is provided in the through hole and connects the first metallic foil to the second metallic foil.

A tenth aspect of the present invention is directed to the package for a semiconductor device according to the ninth aspect of the present invention, wherein the through hole includes a slit-shaped hole.

An eleventh aspect of the present invention is directed to a package for a semiconductor device having a plurality of laminated double-sided printed circuit boards which enclose a cavity for placing a semiconductor chip, at least one of the double-sided printed circuit boards comprising an insulating substrate having first and second main surfaces, and an opening for forming the cavity, a first wiring layer provided on the first main surface of the insulating substrate, a second wiring layer provided on the second main surface of the insulating substrate, a first pad provided on the first wiring layer, and a second pad provided on the first main surface side of the second wiring layer.

A twelfth aspect of the present invention is directed to a package for a semiconductor device having a plurality of double-sided printed circuit boards laminated such that a portion where a cavity for placing a semiconductor chip should be formed is hollow, at least one of the double-sided printed circuit boards comprising an insulating substrate having first and second main surfaces, and a slit-shaped through hole which penetrates a portion from the first main surface to the second main surface, a first wiring layer which is provided on the first main surface of the insulating substrate and has an opening conforming to the through hole, a second wiring layer which is provided on the second main surface of the insulating substrate and has an opening conforming to the through hole, and a metallic wire which is provided in the through hole and connects the first wiring layer to the second wiring layer.

According to the first aspect of the present invention, the method for manufacturing a semiconductor device comprises the steps of patterning the second metallic foil with a region covering the first hole left, and bonding a predetermined member to the second main surface of the insulating substrate so as to form a chamber which faces the region covering the first hole and is sealed. The second metallic foil is not plated when forming the first conductive path. Only the second metallic foil is patterned. Consequently, a thin conductor layer can be patterned and a pitch between the patterned wirings can be reduced.

According to the second aspect of the present invention, the method for manufacturing a semiconductor device comprises the steps of forming the first metallic foil on the first main surface of the insulating substrate, forming the first hole which penetrates the insulating substrate and the first metallic foil, and laminating the second metallic foil on the second main surface of the insulating substrate. The order of steps according to the prior art can be replaced. Consequently, the first printed circuit board can be prepared easily.

According to the third aspect of the present invention, the method for manufacturing a semiconductor device comprises the steps of preparing the insulating substrate having the first and second metallic foils provided on the first and second main surfaces thereof respectively, patterning the first metallic foil in a region where the first hole should be formed, and irradiating laser beams from the patterned first metallic foil side. The insulating substrate having metallic foils provided on both sides thereof can be used. Consequently, the first printed circuit board can be prepared easily.

According to the fourth aspect of the present invention, the second conductive path for connecting the third metallic foil to the first metallic foil is simultaneously formed at the step of forming the first conductive path. Consequently, the steps of performing plating to form the conductive path and the like can be reduced more as compared with the steps of forming the first and second conductive paths separately. Thus, the manufacturing process can be simplified.

According to the fifth aspect of the present invention, the method for manufacturing a semiconductor device comprises the step of forming a third hole which penetrates the third metallic foil to reach the fourth metallic foil and is covered with the fourth metallic foil for the first printed circuit board before the step of forming the first conductive path. Consequently, the first conductive path can be formed on the first hole. At the same time, a conductive path can be formed on the third hole. Thus, the manufacturing process can be simplified.

According to the sixth aspect of the present invention, the laminated product which is formed by bonding the insulating substrate to the second printed circuit board is used. The chamber is formed between the insulating substrate and the second printed circuit board. Consequently, it is possible to obtain a semiconductor device in which a portion for supporting a cover is provided on the insulating substrate and bonding can be performed by using a fifth metallic foil that is patterned on the second main surface of the second printed circuit board.

According to the seventh aspect of the present invention, the first hole is a slit-shaped hole. Consequently, the resistance value of an interstitial via hole can be reduced.

According to the eighth aspect of the present invention, the pad is formed on the outer wall and bottom of the slit-shaped hole which is exposed at the steps of scraping off the inner wall of the slit-shaped hole with the outer wall thereof left so as to expose the bottom section of the slit-shaped hole, and scraping off the upper portion of the outer wall of the slit-shaped hole to perform spot-facing for exposing the bottom of the slit-shaped hole. Consequently, the pad can be formed at a height corresponding to the first and second main surfaces of the insulating substrate. The semiconductor device can be easily manufactured by varying the height of the pad.

According to the ninth aspect of the present invention, a package for a semiconductor device comprises a second metallic foil which is provided on the second main surface of the insulating substrate and has a region that covers the through hole. Therefore, the first and second main surfaces of the insulating substrate are blocked. For example, the second metallic foil is not exposed to a liquid such as a plating solution or gases when plating the first metallic foil. Thus, it is possible to obtain the package for a semiconductor device which can be manufactured easily.

According to the tenth aspect of the present invention, the metallic wiring is provided on the slit-shaped hole as a through hole. Consequently, the resistance value of the metallic wiring can be reduced.

According to the eleventh aspect of the present invention, the first and second pads are provided on the first main surface side. However, the heights of the first and second pads are different from each other by the thickness of the insulating substrate. Consequently, it is possible to lessen a possibility that the bonded wires might be short-circuited.

According to the twelfth aspect of the present invention, the metallic wiring which is provided in the through hole and connects the first and second wiring layers is slit-shaped. Consequently, the connection resistance of the first and second wiring layers can be reduced.

In order to solve the above-mentioned problems, it is an object of the present invention to reduce the number of manufacturing steps by plating a through hole and an interstitial via hole at the same time.

It is another object of the present invention to perform patterning easily at a small pitch without a plated layer formed on a copper foil when plating is carried out to form the interstitial via hole.

It is yet another object of the present invention to provide a method for manufacturing a semiconductor device having a printed circuit board type BGA package in which a step of filling the interstitial via hole with a resin can be omitted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a sectional view showing a step in manufacturing the semiconductor device according to the first embodiment of the present invention;

FIG. 15 is a perspective view showing the structure of a semiconductor device according to the first embodiment of the present invention;

FIG. 58 is a sectional view for explaining the relationship of the thickness of a wiring with a space between the wirings; and FIG. 59 is a sectional view for explaining the relationship of the thickness of the wiring with the space between the wirings.

DESCRIPTION OF THE PREFERRED EMBODIMENTS

First Embodiment

A method for manufacturing a semiconductor device according to a first embodiment of the present invention will be described below. FIGS. 1 to 14 are sectional views showing step in manufacturing the semiconductor device. After sequentially performing the steps shown in FIGS. 1 to 14, the semiconductor device according to the first embodiment is completed.

Figure 1:
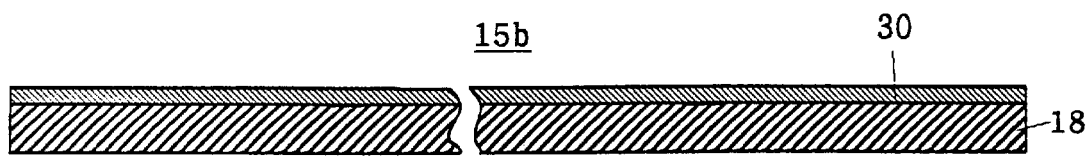
FIG. 1 is a sectional view showing a step in manufacturing a semiconductor device according to a first embodiment of the present invention.
Figure 2:
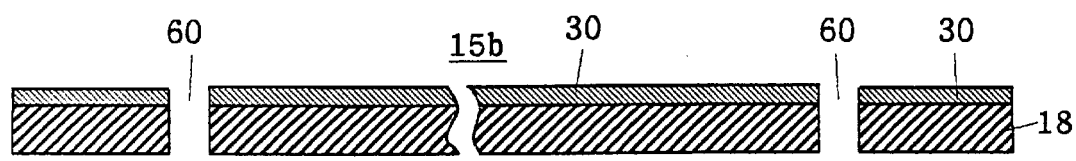
FIG. 2 is a sectional view showing a step in manufacturing the semiconductor device according to the first embodiment of the present invention.

As shown in FIG. 1, a printed circuit board 15b is prepared in which a copper foil 30 is formed on one of main surfaces of an insulating substrate 18. The printed circuit board 15b is a kind of laminated product comprising the copper foil and the insulating substrate. As shown in FIG. 2, a hole 60 for an interstitial via hole is formed. The hole 60 penetrates the printed circuit board 15b.

Figure 3:
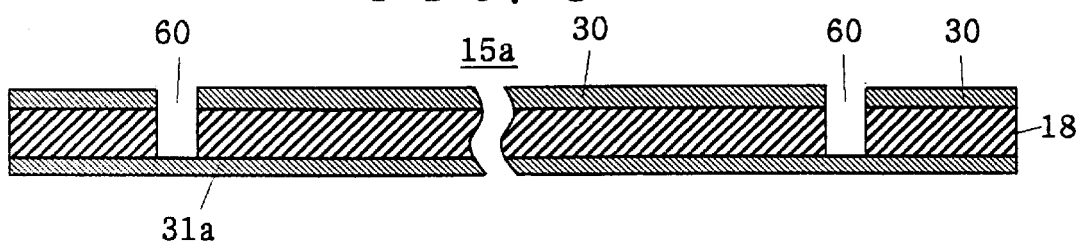
FIG. 3 is a sectional view showing a step in manufacturing the semiconductor device according to the first embodiment of the present invention.
Figure 4:
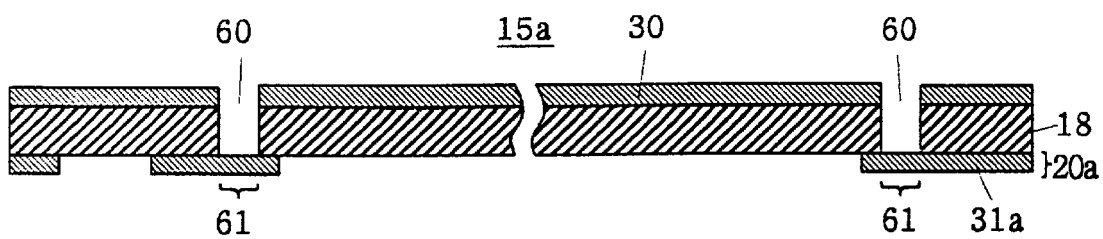
FIG. 4 is a sectional view showing a step in manufacturing the semiconductor device according to the first embodiment of the present invention.
Figure 47:
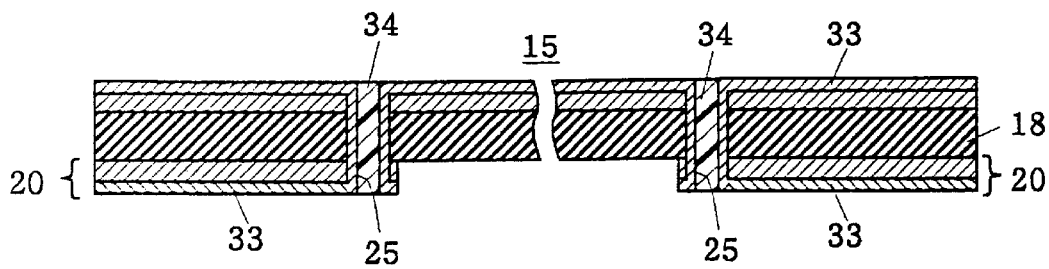
FIG. 47 is a sectional view showing a step in manufacturing the semiconductor device according to the prior art.

Then, a copper foil 31a is laminated on the other main surface of the insulating substrate 18 so that a double—sided printed circuit board 15a is formed (see FIG. 3). As shown in FIG. 4, the copper foil 31a of a wiring layer 20a is patterned. At this time, the copper foil 31a in a region 61 which covers the hole 60 is not etched but left. In this case, the patterned wiring layer 20a is formed by only the copper foil 31a. Consequently, the pitch of a wiring pattern can be reduced more than the pattern of the wiring layer 20 shown in FIG. 47.

Figure 5:
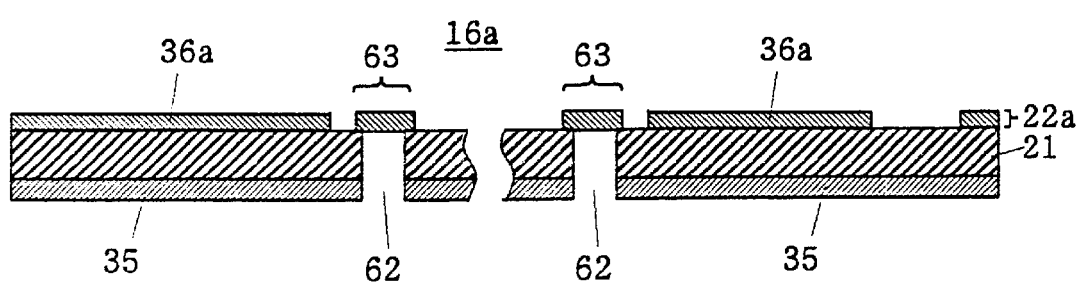
FIG. 5 is a sectional view showing a step in manufacturing the semiconductor device according to the first embodiment of the present invention.
Figure 6:
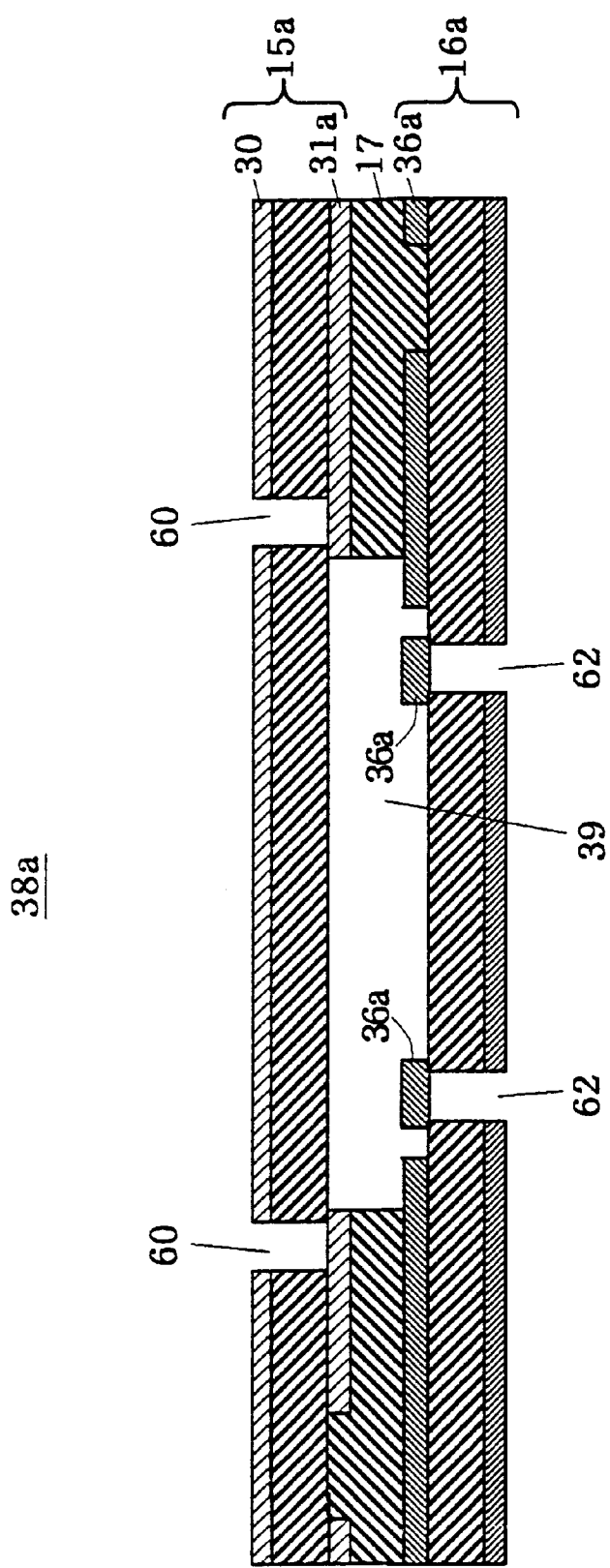
FIG. 6 is a sectional view showing a step in manufacturing the semiconductor device according to the first embodiment of the present invention.
Figure 48:
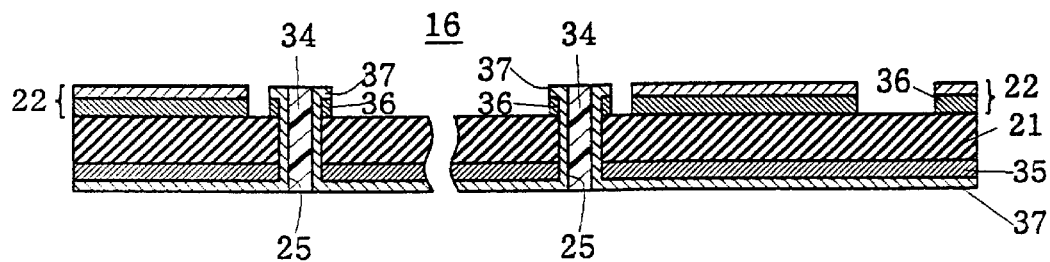
FIG. 48 is a sectional view showing a step in manufacturing the semiconductor device according to the prior art.
Figure 49:
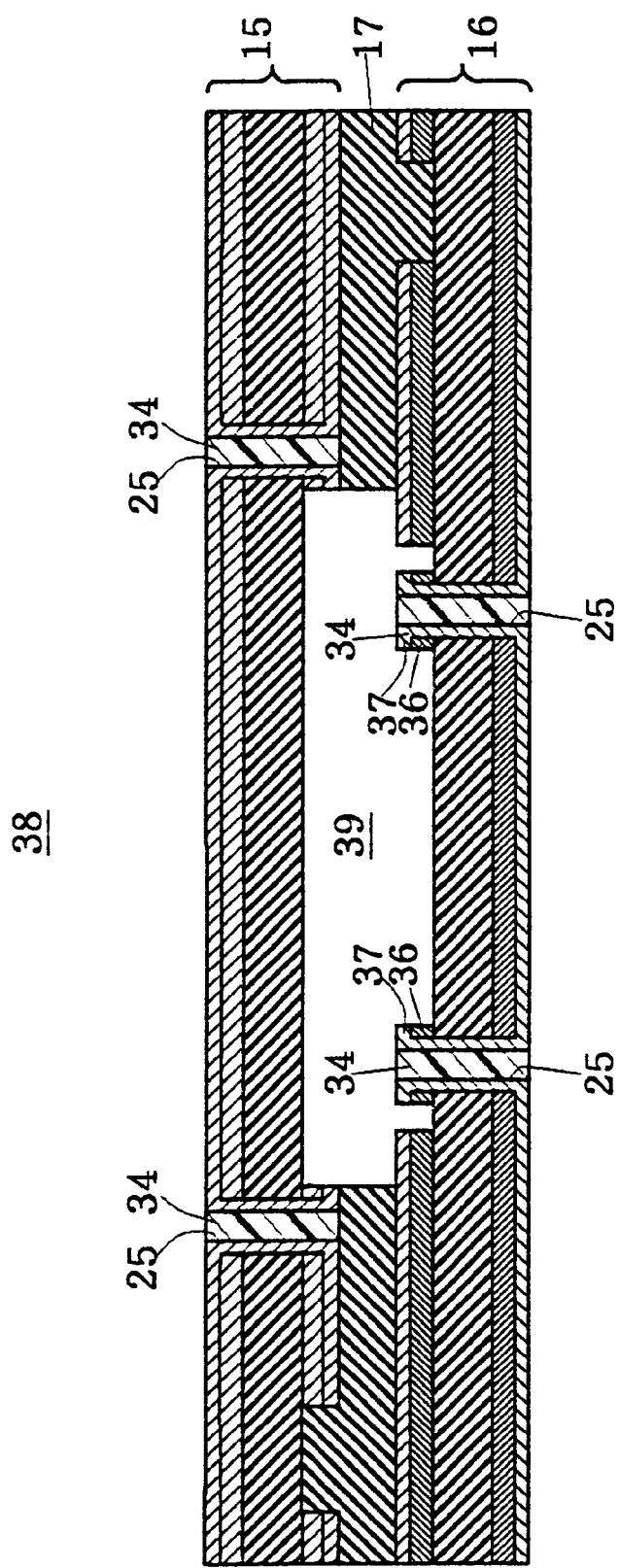
FIG. 49 is a sectional view showing a step in manufacturing the semiconductor device according to the prior art.
Figure 50:
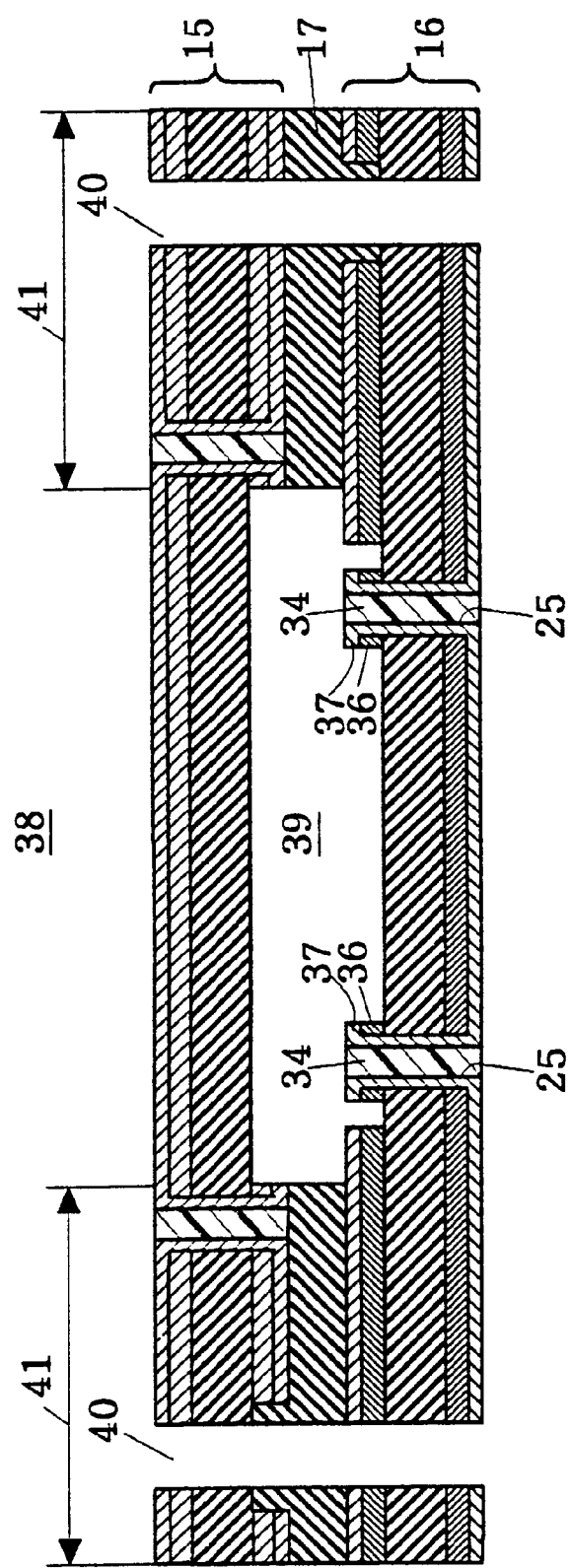
FIG. 50 is a sectional view showing a step in manufacturing the semiconductor device according to the prior art.
Figure 51:
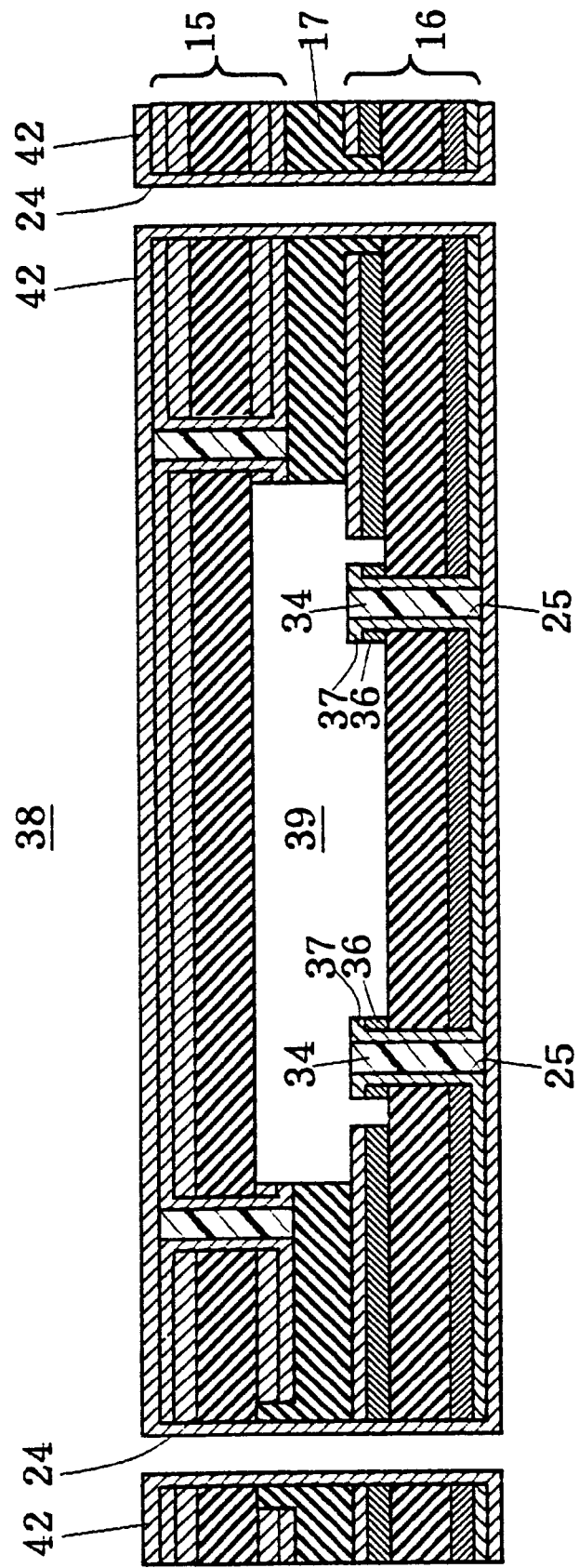
FIG. 51 is a sectional view showing a step in manufacturing the semiconductor device according to the prior art.
Figure 52:
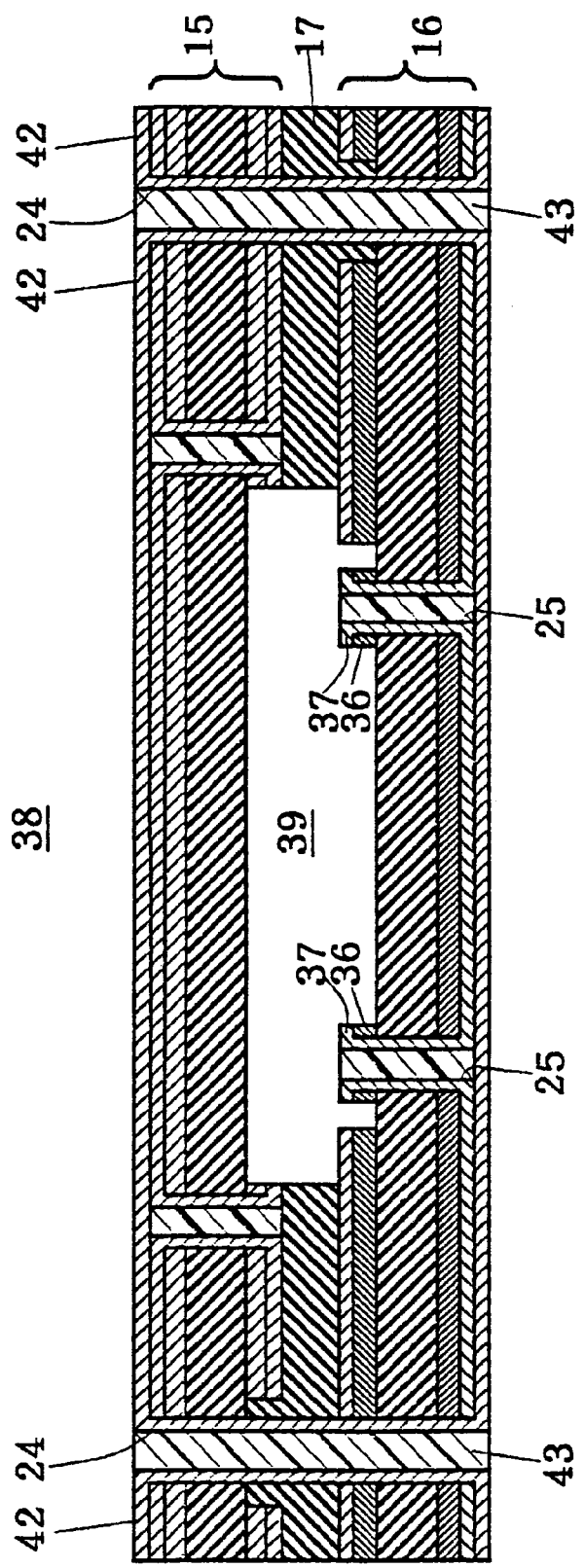
FIG. 52 is a sectional view showing a step in manufacturing the semiconductor device according to the prior art.

After performing the same steps as the steps shown in FIGS. 1 to 4, a double-sided printed circuit board 16a is prepared in which a hole 62 for an interstitial via hole is formed and a wiring layer 29a is patterned (see FIG. 5). A copper foil 36a in a region 63 where the hole 62 for the interstitial via hole is formed is left. The patterned wiring layer 22a is formed by only the copper foil 36a. Consequently, the pitch of a wiring pattern can be reduced more than in the patterned wiring layer 22 shown in FIG. 48.

Figure 7:
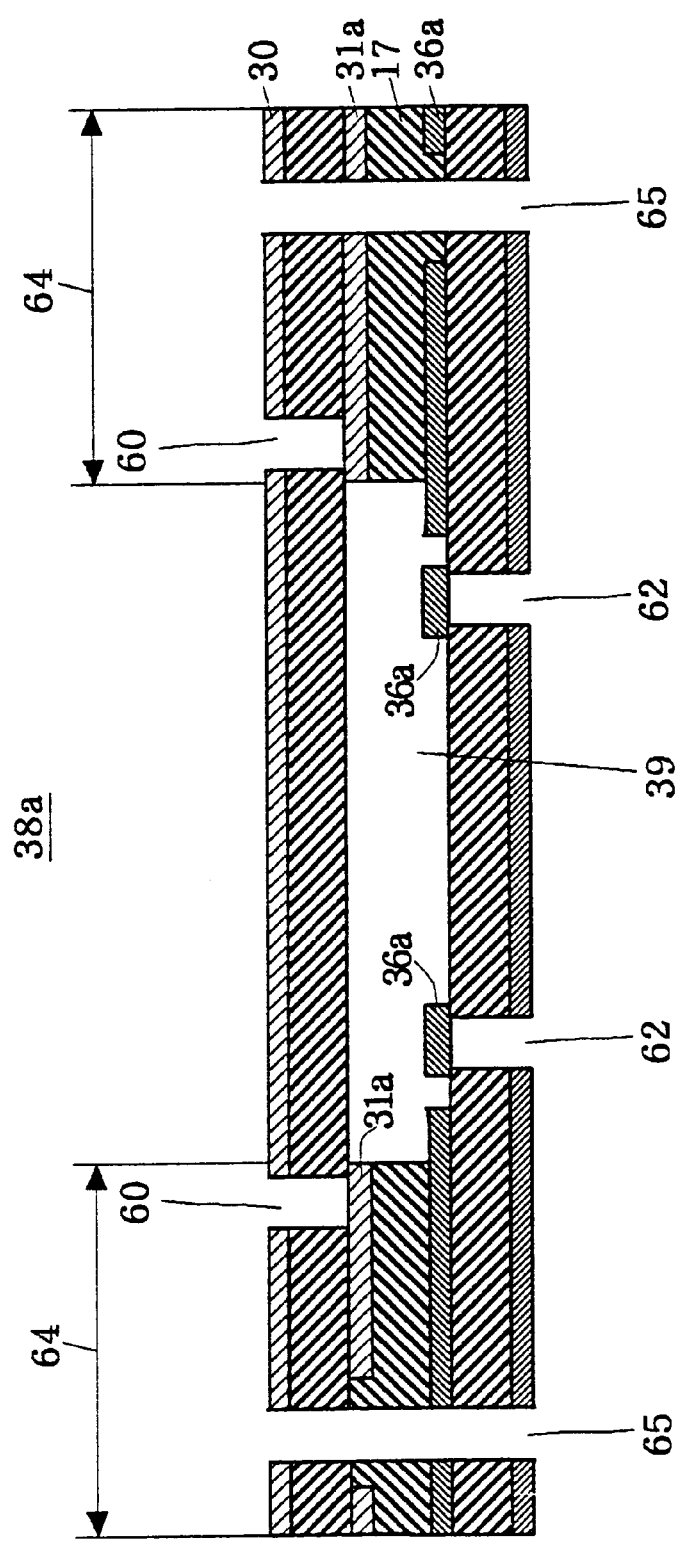
FIG. 7 is a sectional view showing, a step in manufacturing the semiconductor device according to the first embodiment of the present invention.

The double-sided printed circuit board 15a shown in FIG. 4 is bonded to a double-sided printed circuit board 16a shown in FIG. 5 by a prepreg 17. Consequently, a laminated printed circuit board 38a is formed as an aggregate of the double-sided printed circuit boards 15a and 16a (see FIG. 6). The prepreg 17 is not present in some regions so that a chamber 39 for forming a cavity is provided between the double-sided printed circuit boards 15a and 16a in the central portion of the laminated printed circuit board 38a. A hole 65 is formed in a region 64 of the laminated printed circuit board 38a where the prepreg 17 is inserted. The hole 65 penetrates the laminated printed circuit board 38a (see FIG. 7). The laminated printed circuit board 38a on which the hole 65 is formed is plated with copper so that a copper plated layer 66 is formed. Thus, a through hole 24 and an interstitial via hole 25a are formed (see FIG. 8). In that case, it is apparent that the metal surfaces of the copper foils 31a and 36a are exposed and contact the copper plated layer 66 after the cleaning technique according to the prior art. The laminated printed circuit board 38a is immersed in a plating solution so as to be plated with copper. As shown in FIG. 7, however, the holes 60 and 62 for the interstitial via holes are closed by the copper foils 31a and 36a so that the chamber 39 is sealed. Consequently, the plating solution does not invade the chamber 39.

Figure 9:
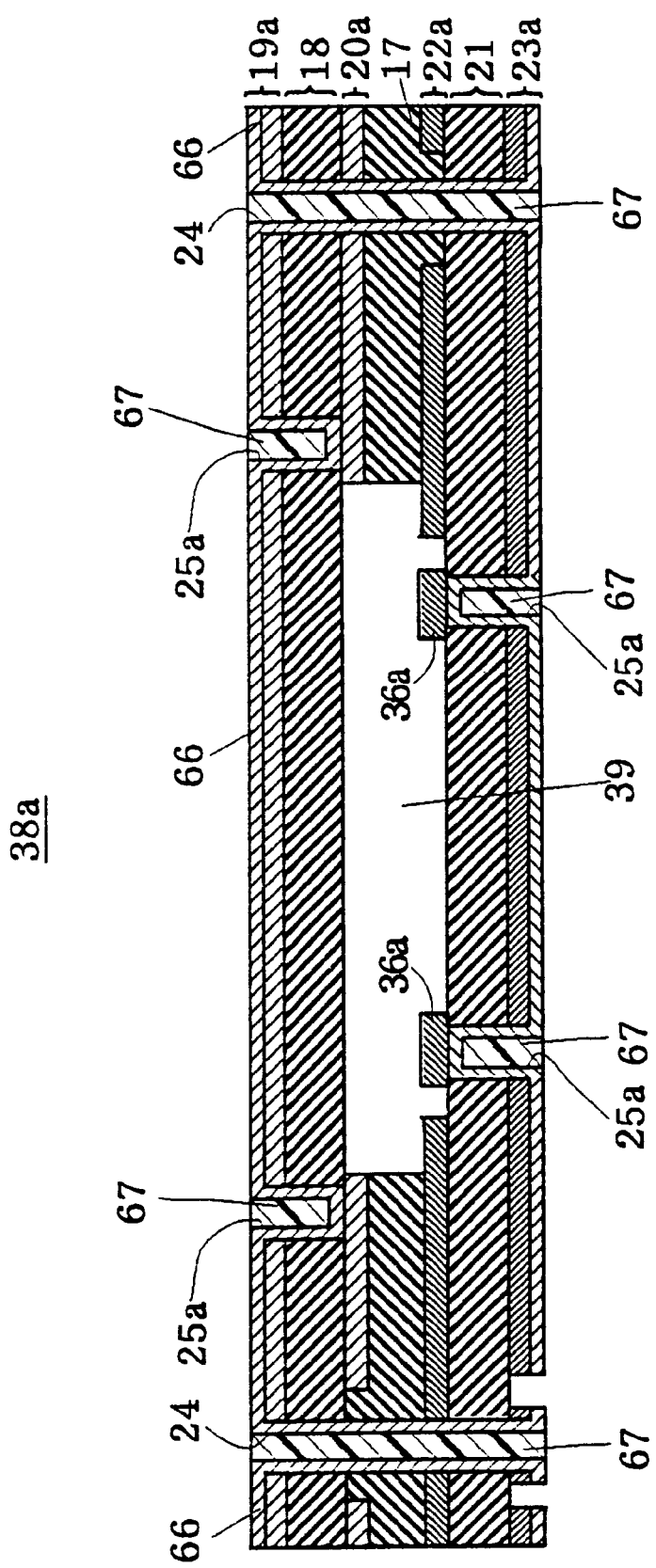
FIG. 9 is a sectional view showing a step in manufacturing the semiconductor device according to the first embodiment of the present invention.
Figure 53:
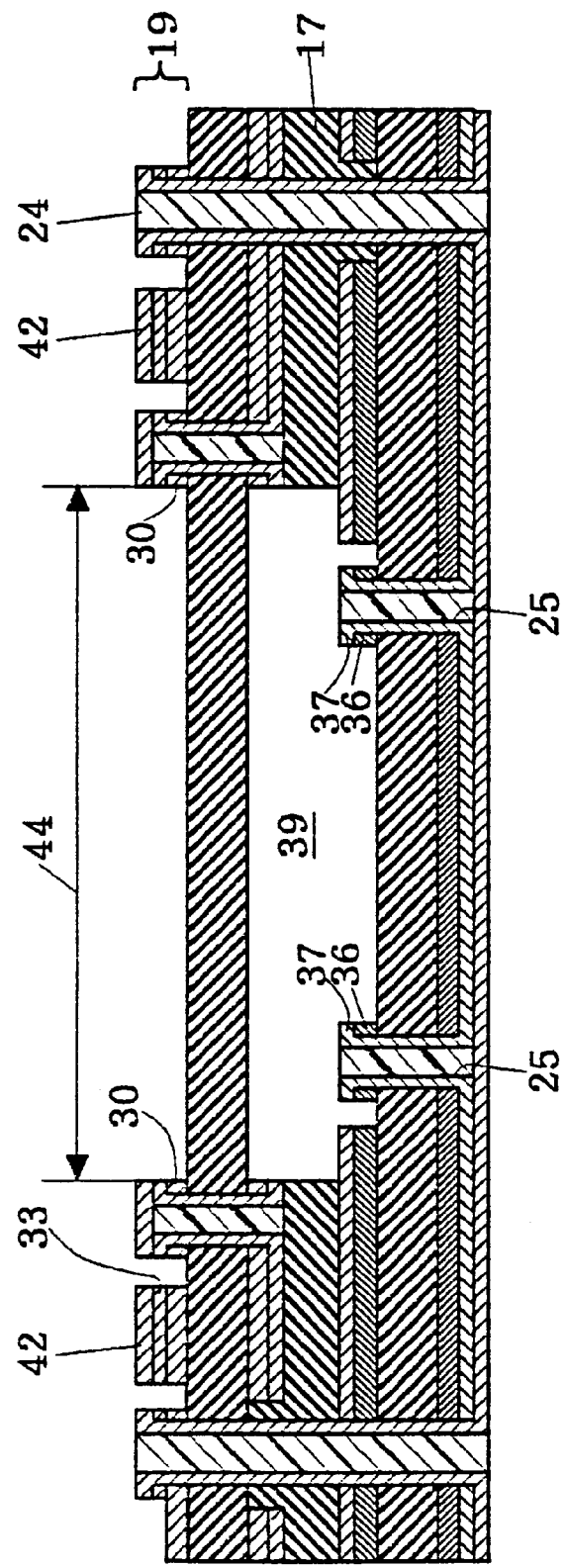
FIG. 53 is a sectional view showing a step in manufacturing the semiconductor device according to the prior art.
Figure 54:
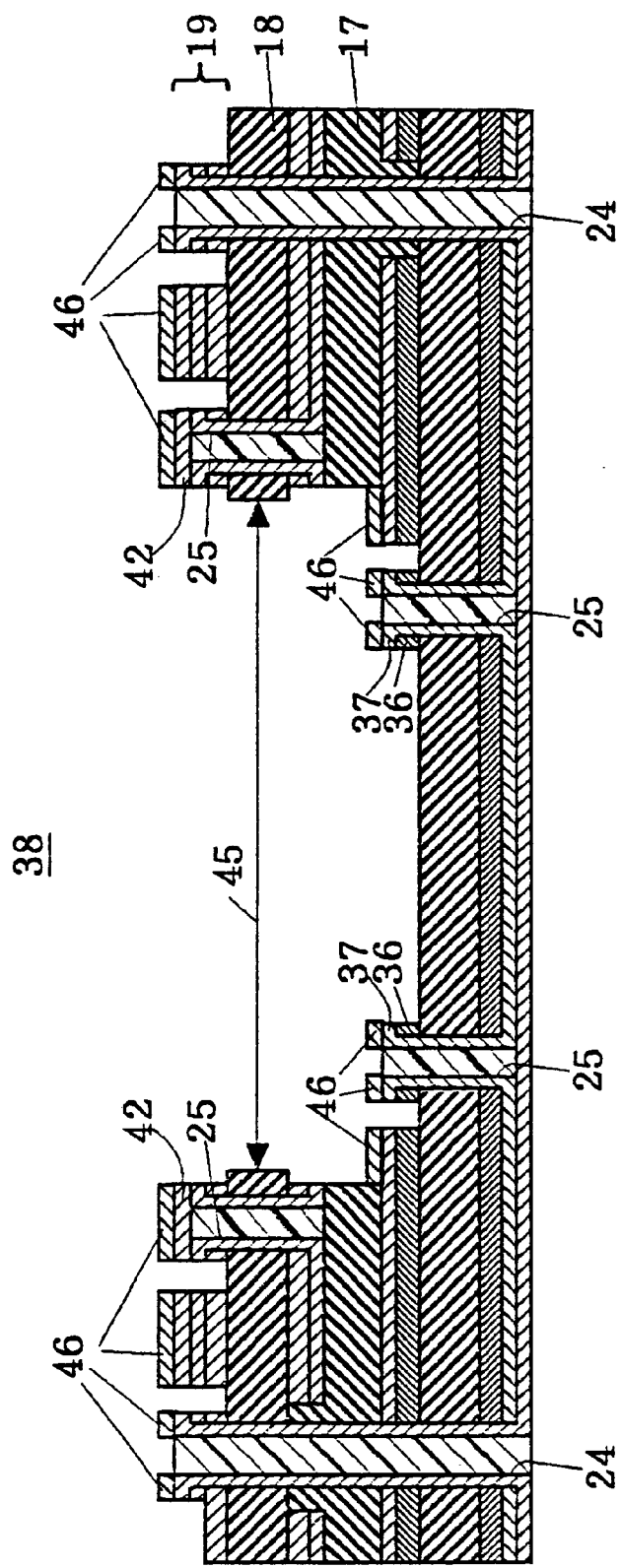
FIG. 54 is a sectional view showing a step in manufacturing the semiconductor device according to the prior art.

As shown in FIG. 9, the through hole 24 and the interstitial via hole 25a are filled with a resin 67. A wiring layer 19a is patterned (see FIG. 10). In that case, the copper foil 30 and the copper plated layer 66 provided in an upper region 44 of the chamber 39 are also removed. At this time, the thickness of the patterned wiring layer 19a is smaller, by the thickness of a copper plated layer 42, than that the wiring layer 19 according to the prior art which is being patterned as shown in FIG. 53. Consequently, it is easy in the invention to form a finer pattern.

The insulating substrate 18 provided in the upper region 44 is opened by a router so that an opening 45 is formed. After that, nickel-gold plating is performed so that a nickel-gold plated layer 69 is formed on the copper plated layers 36a and 66 (see FIG. 11).

Figure 12:
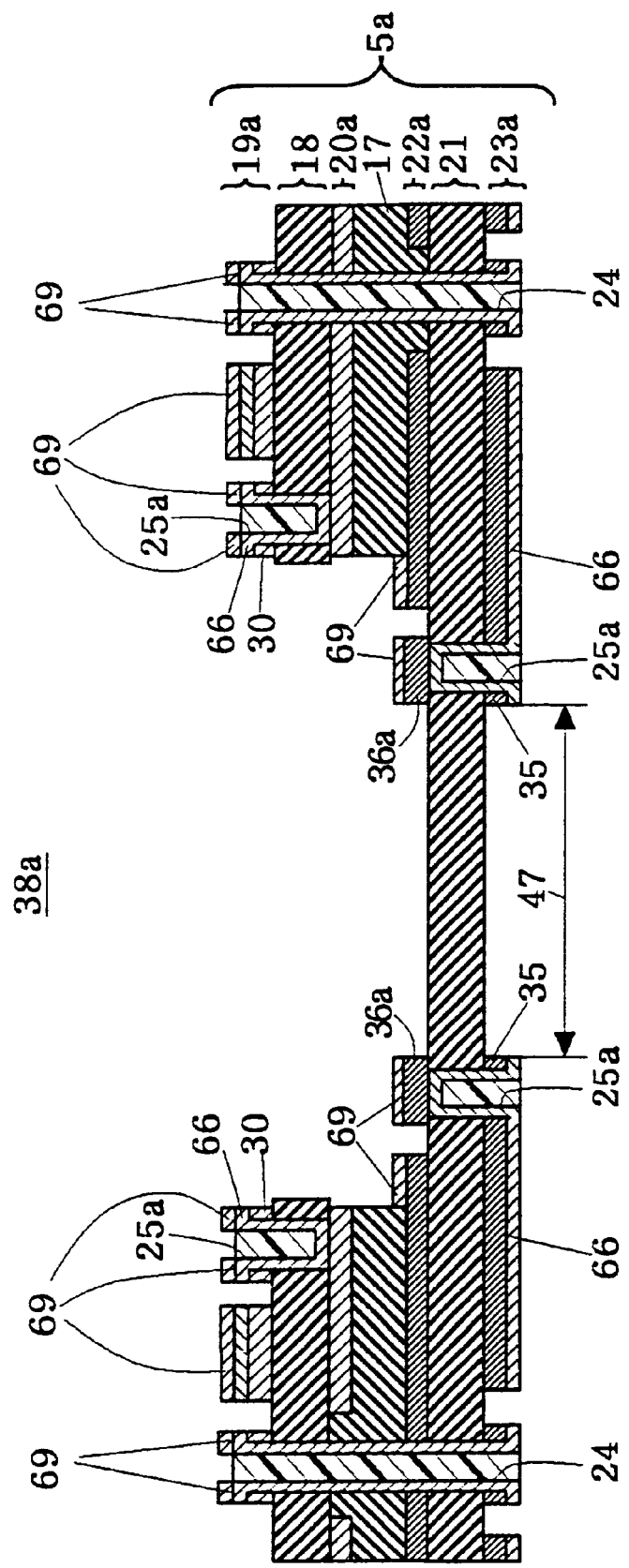
FIG. 12 is a sectional view showing a step in manufacturing the semiconductor device according to the first embodiment of the present invention.
Figure 55:
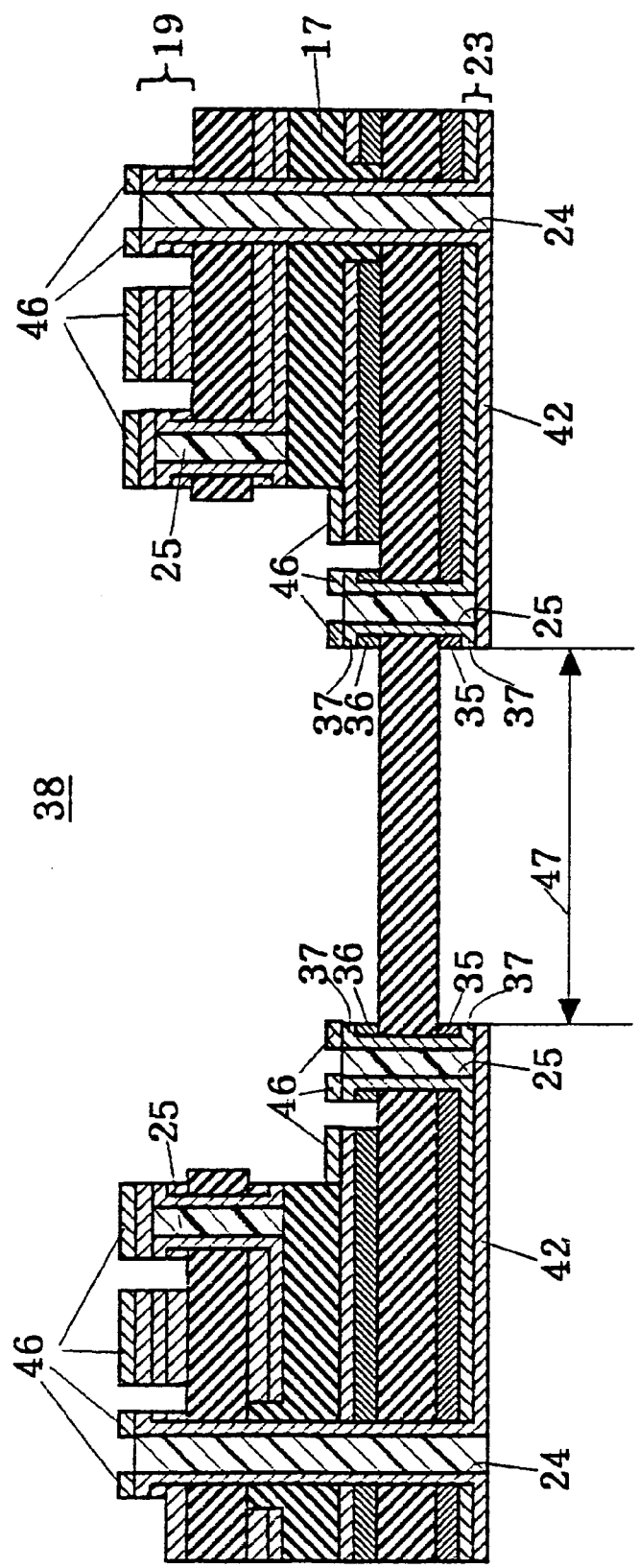
FIG. 55 is a sectional view showing a step in manufacturing the semiconductor device according to the prior art.
Figure 56:
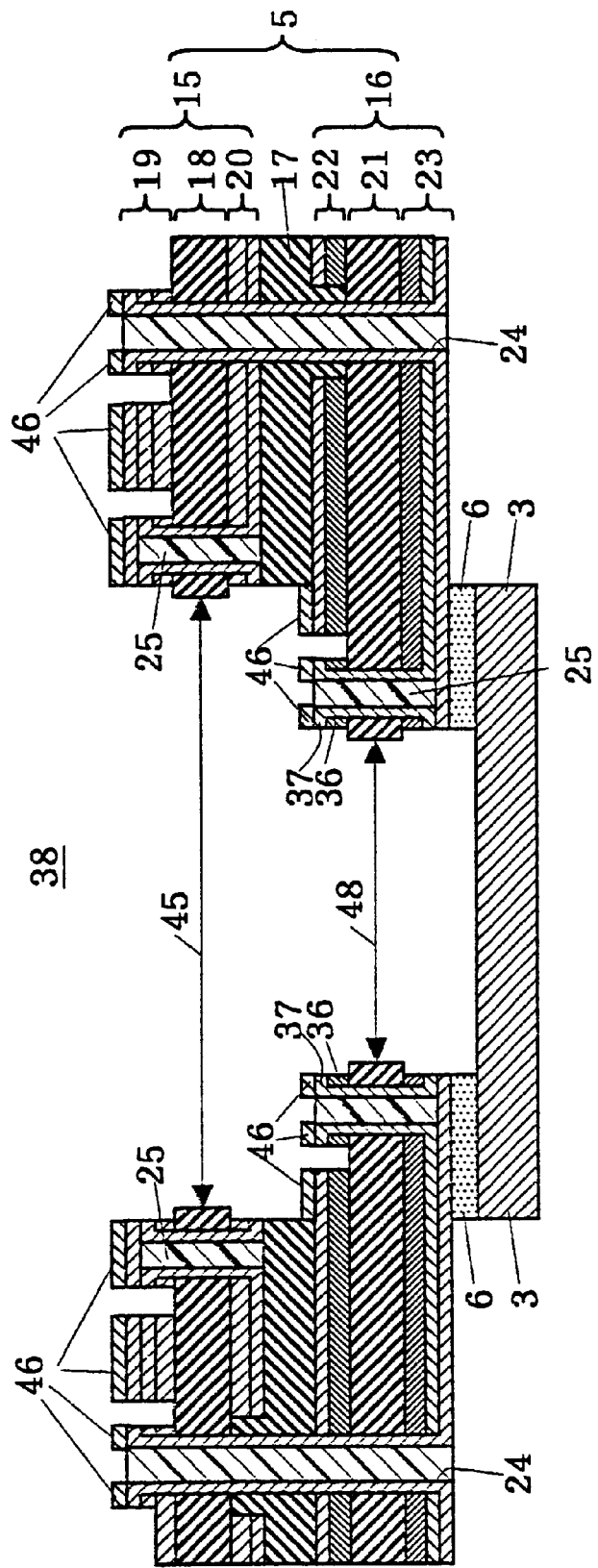
FIG. 56 is a sectional view showing a step in manufacturing the semiconductor device according to the prior art.
Figure 57:
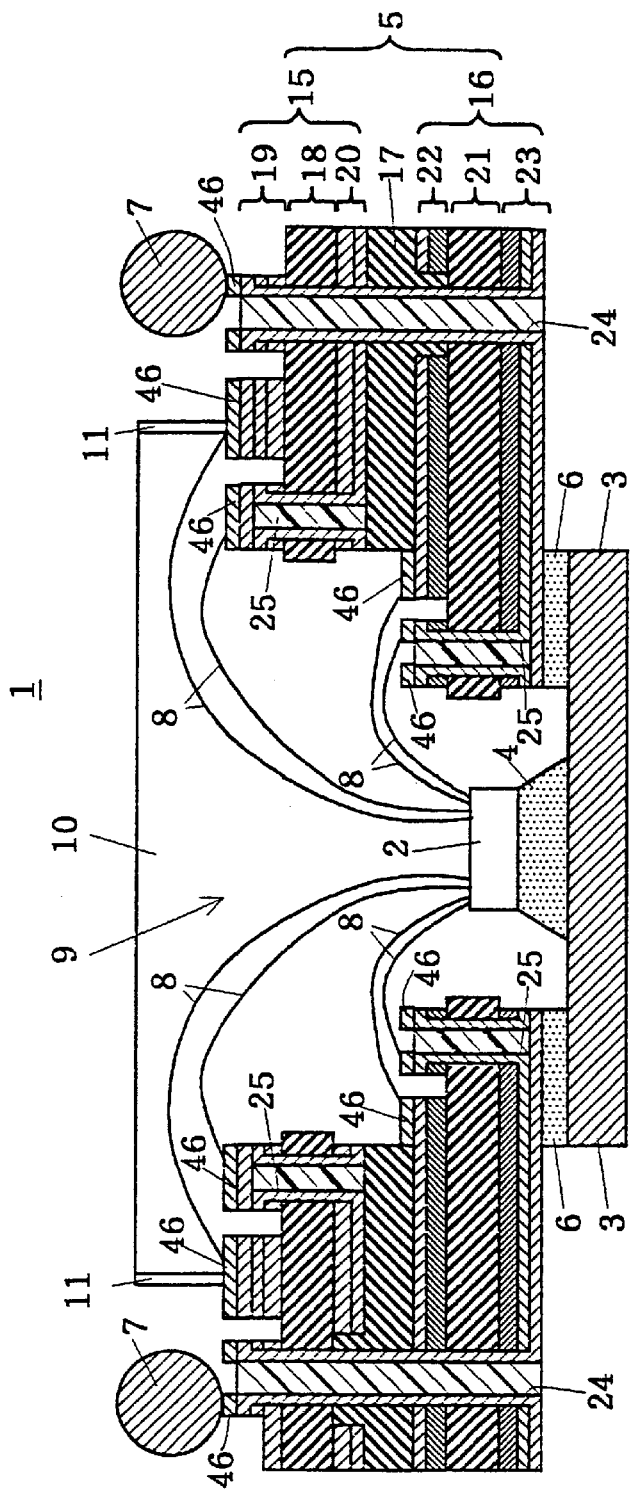
FIG. 57 is a sectional view showing a step in manufacturing the semiconductor device according to the prior art.
Figure 5:
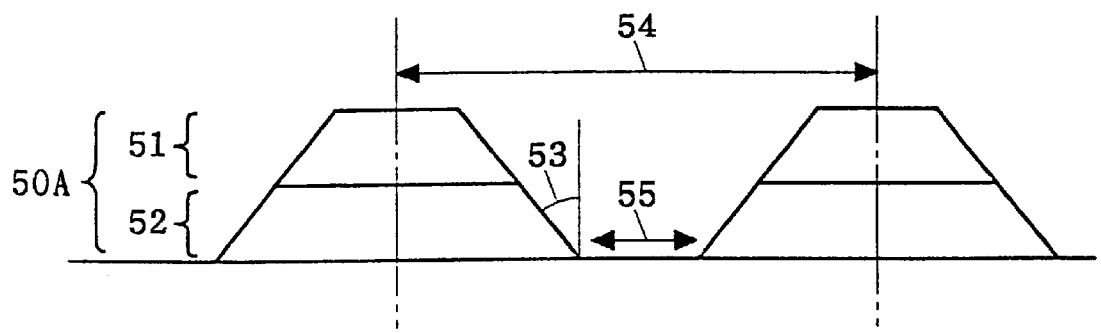

Then, a wiring layer 23a is patterned as shown in FIG. 12. In that case, a copper foil 35 and the copper plated layer 66 which are provided in a region 47 below the chamber 39 are removed. The patterned wiring layer 23a is formed by the copper foil 35 and the copper plated layer 66, and has a thickness which is smaller, by the thickness of a copper plated layer 42, than that of the wiring layer 23 according to the prior art which is being patterned as shown in FIG. 55. Consequently, it is easy to make the pattern of the wiring layer 23a finer.

Figure 13:
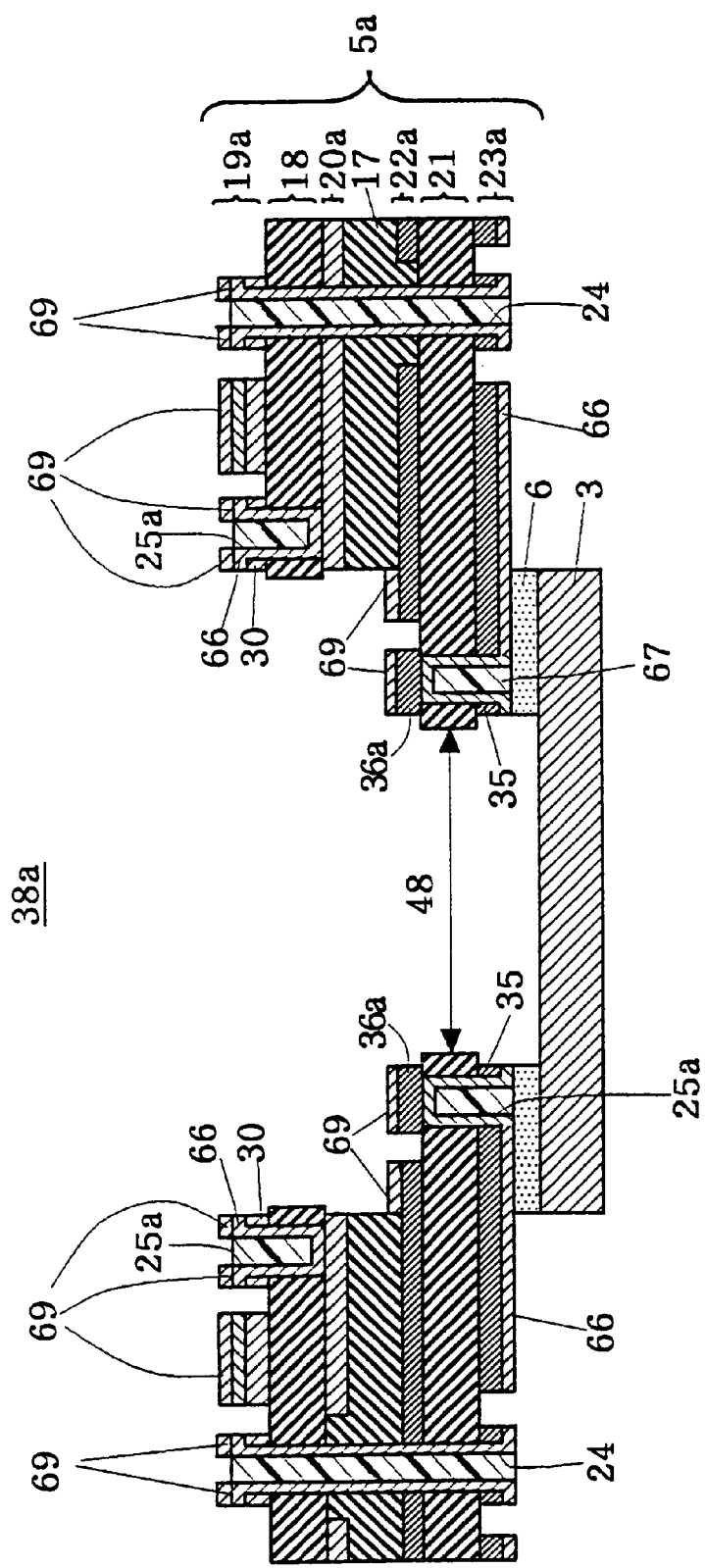
FIG. 13 is a sectional view showing a step in manufacturing the semiconductor device according to the first embodiment of the present invention.

As shown in FIG. 13, an opening 48 is formed in the region 47 so that a frame 5a is completed. A slug 3 is bonded to the frame 5a with an adhesive 6.

As shown in FIG. 14, a chip 2 is bonded to the slug 3 with a die bonding resin 4 and is connected to a nickel-gold plated layer 69 by a wire 8. After a dam 11 is attached, a cavity 9 is filled with a sealing resin 10. Consequently the package is sealed. Then, a solder ball 7 is formed on the nickel-gold plated layer of the wiring layer 19a. Thus, a semiconductor device 1a having a printed circuit board type BGA package is completed.

Figure 16:
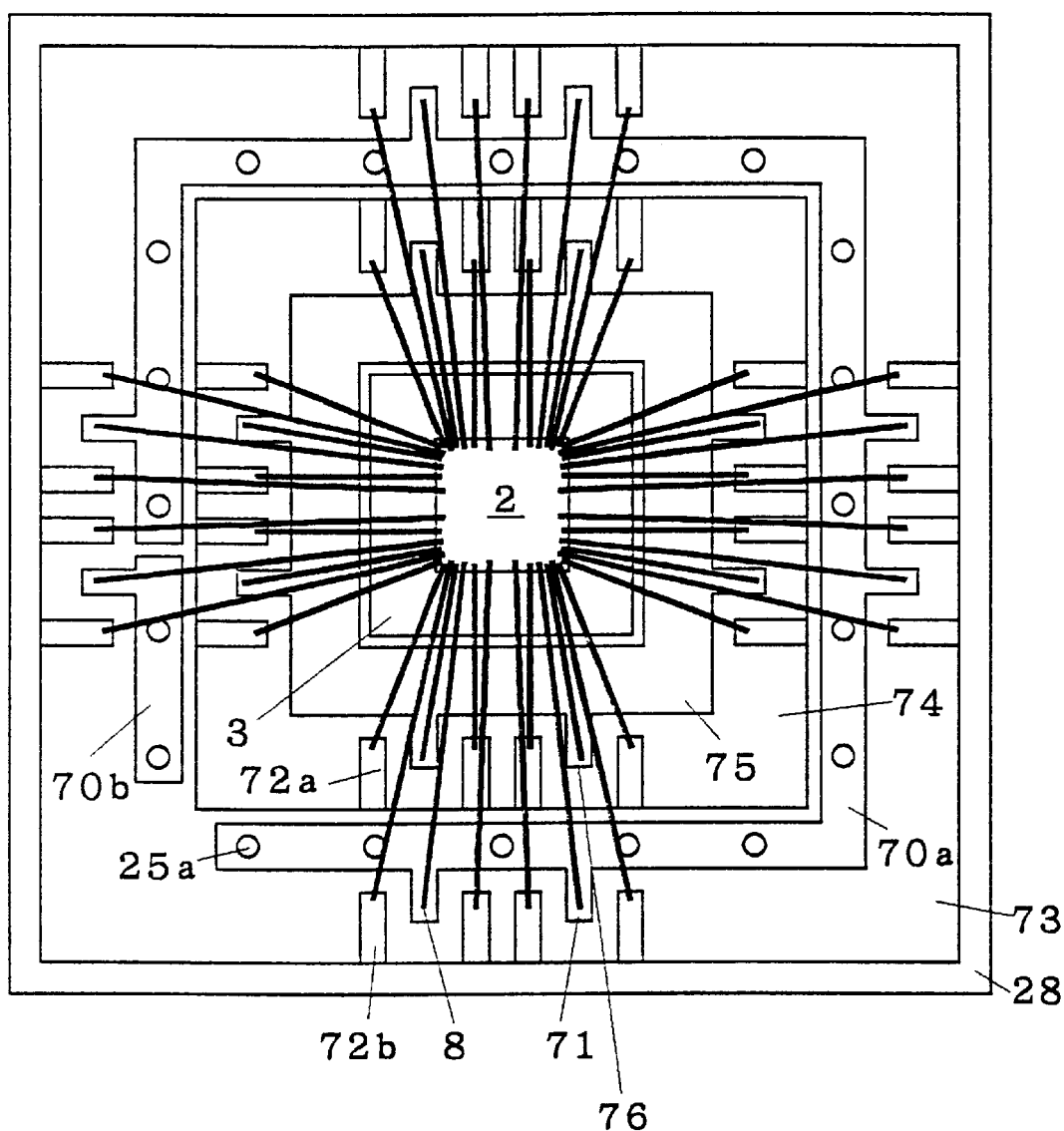
FIG. 16 is a plan view showing the structure of the semiconductor device according to the first embodiment of the present invention.
Figure 17:
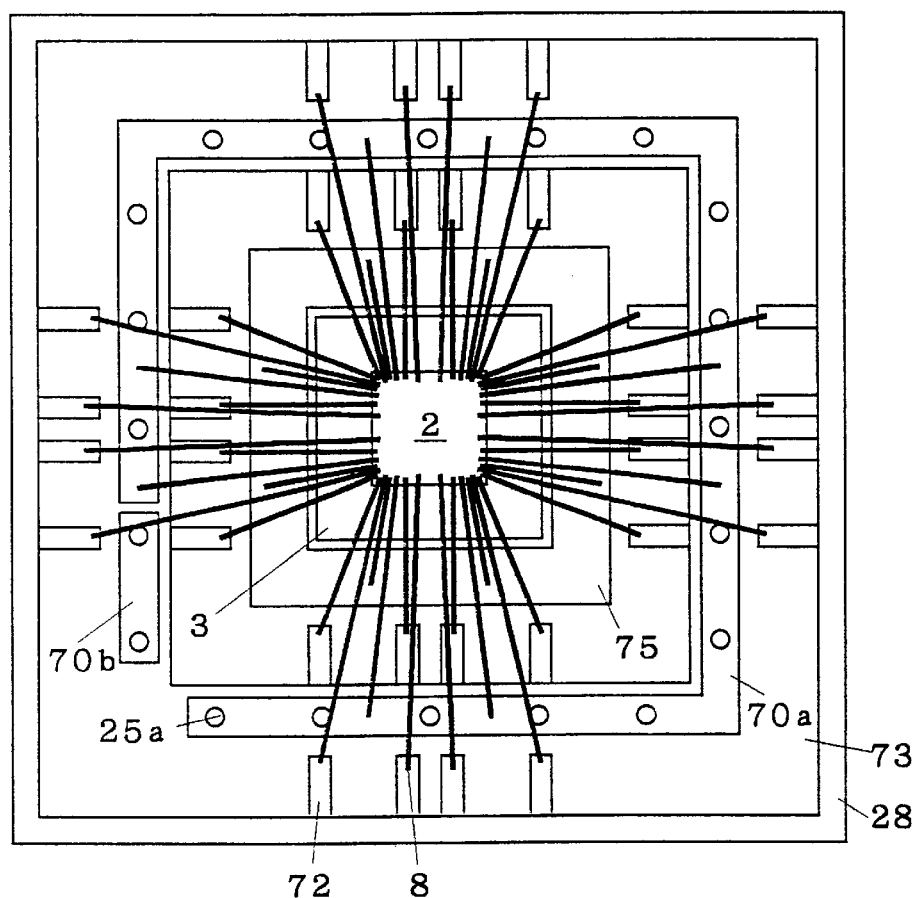
FIG. 17 is a plan view showing the structure of the semiconductor device according to the first embodiment of the present invention.

FIG. 15 is a perspective view showing the structure of the printed circuit board type BGA package shown in FIG. 14. In FIG. 15, the resin 10 shown in FIG. 14 is omitted or the state in which the resin 10 has not been injected is shown. In FIG. 15, the same reference numerals designate the same portions as in FIG. 14. FIG. 16 is an enlarged plan view showing the central portion of the printed circuit board type BGA package shown in FIG. 15. In FIG. 16, the reference numerals 70a and 70b designate power source—ground rings which are provided on an upper stage 73 and supply a source voltage and a ground voltage, the reference numeral 71 designates a wire bonding pad which protrudes from the power source—ground rings 70a and 70b in order to arrange stitch bonding positions, the reference numeral 72a designates a wire bonding pad which is provided on a lower stage 74 of the frame 5a, the reference numeral 72b designates a wire bonding pad provided on the upper stage 73 of the frame Da, the reference numeral 75 designates a power source ground—plane which is provided on the lower stage 74 and supplies a source voltage or a ground voltage, the reference numeral 76 designates a wire bonding pad which protrudes from the power source—ground plane 75 in order to arrange the stitch bonding positions, and the same reference numerals designate the same portions as in FIG. 14. FIG. 17 is a plan view showing another example of the printed circuit board type BGA package shown in FIG. 15, in which the stitch bonding positions are different from those in FIG. 16. The printed circuit board type BGA package shown in FIG. 17 is characterized in that the wire bonding pads 71 and 76 are not provided but the wire bonding position is placed on the ring. It is apparent that the invention described in the first embodiment can also be applied to the printed circuit board type BGA packages having the structures shown in FIGS. 16 and 17.

Figure 10:
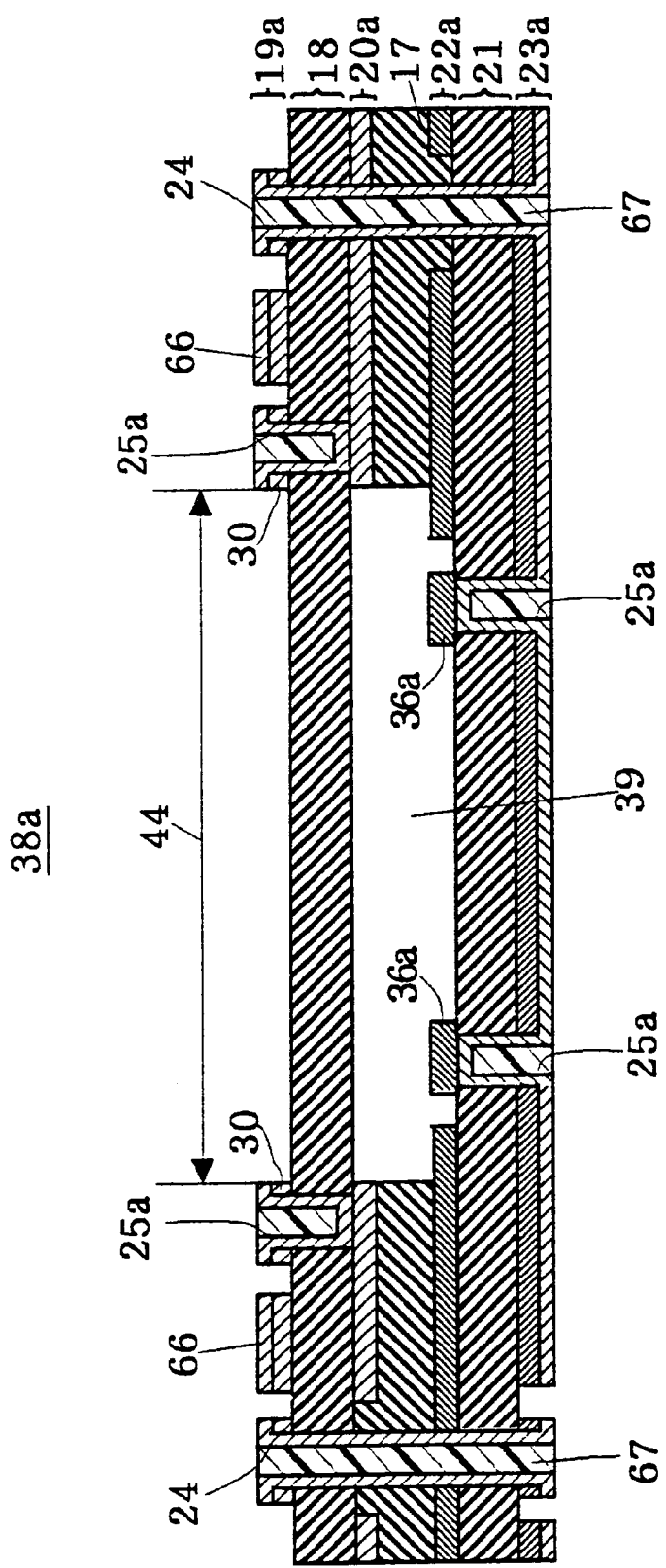
FIG. 10 is a sectional view showing a step in manufacturing the semiconductor device according to the first embodiment of the present invention.
Figure 11:
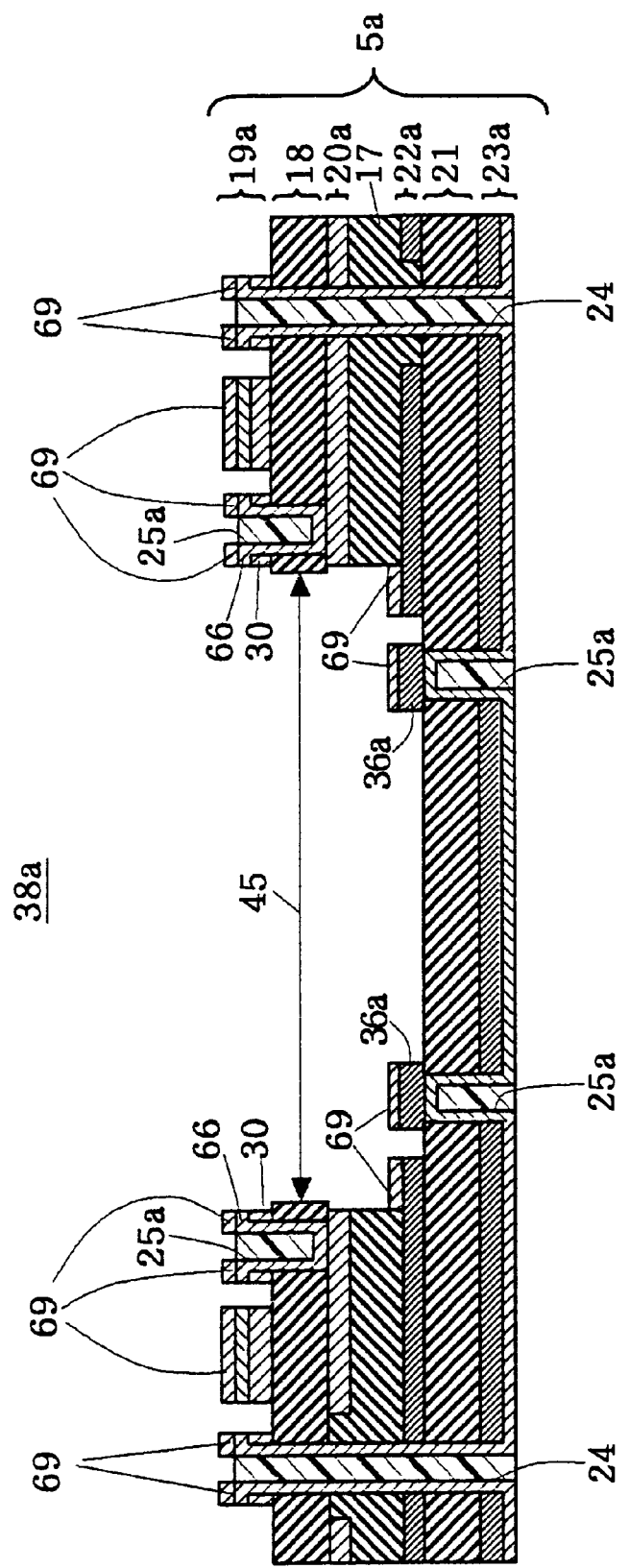
FIG. 11 is a sectional view showing a step in manufacturing the semiconductor device according to the first embodiment of the present invention.

In a method for manufacturing a semiconductor device according to the first embodiment, a thin layer formed by the copper foil 30 and copper plated layer 66 or the copper foil 3) and copper plated layer 66 of the wiring layers 19a and 23a is patterned in the steps shown in FIGS. 10 and 12. Consequently, it is easy to make the pattern finer. Also in the case where the wiring layers 20a and 22a are etched as shown in FIGS. 4 and 5, the copper plated layer is not formed on the copper foils 31a and 36a. Therefore, it is possible to perform finer patterning than in the prior art.

The manufacturing steps shown in FIGS. 1 to 14 are compared with the manufacturing steps shown in FIGS. 43 to 57. At the steps according to the prior art, the through hole 24 and the interstitial via hole 25 are formed and filled with a resin separately. On the contrary, the through hole 24 and the interstitial via hole 25a are simultaneously formed and filled with the resin at the steps shown in FIGS. 1 to 14. Consequently, the process can be simplified.

Figure 8:
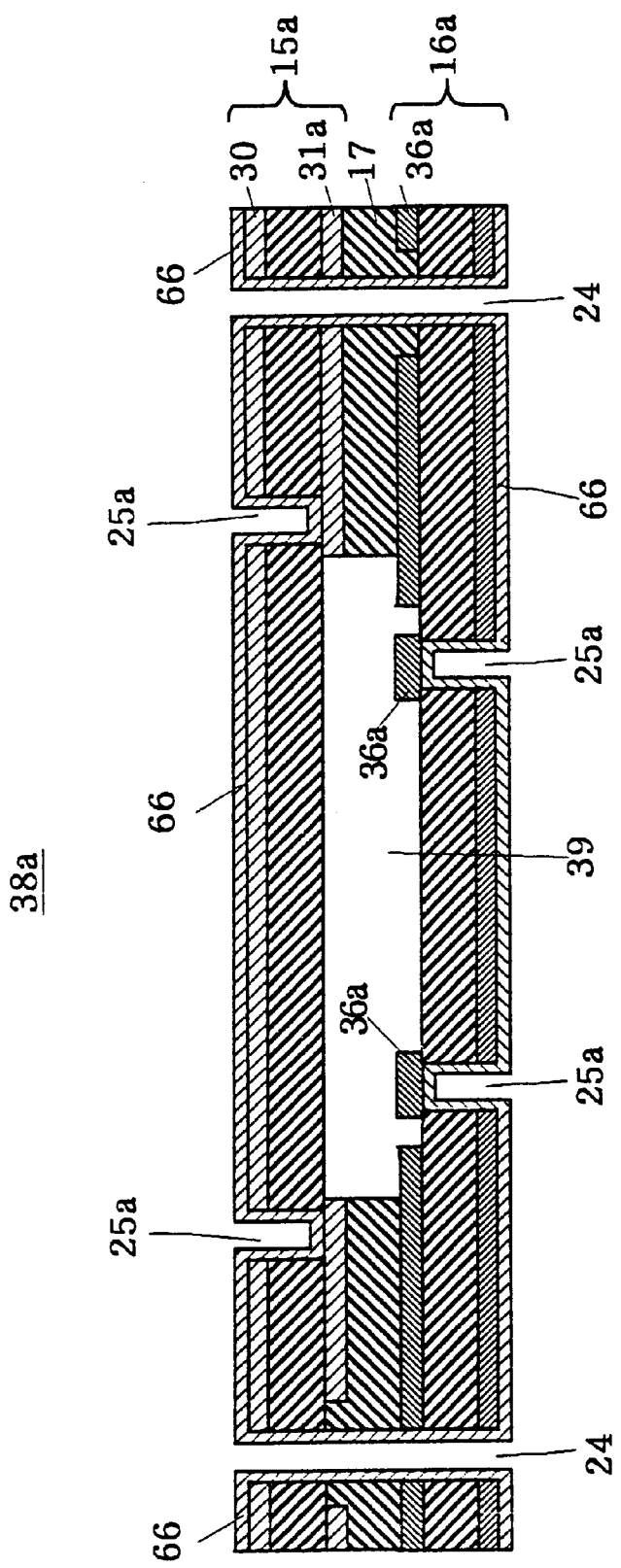
FIG. 8 is a sectional view showing a step in manufacturing the semiconductor device according to the first embodiment of the present invention.

As compared with the semiconductor device according to the prior art, the interstitial via hole 25a is covered with the copper foils 31a and 36a in the semiconductor device according to the first embodiment. Consequently, both sides of the double-sided printed circuit board can be blocked and the plating solution can be prevented from invading during manufacture. Thus, manufacture can be performed easily. If it is not necessary to wire bond to a conductor pattern on the interstitial via hole 25a of the double-sided printed circuit board 16a and to coat with a solder resist, the step of filling the interstitial via hole 25a with a resin may be omitted. If it is not necessary to coat with the solder resist, the step of filling the through hole 24 and the interstitial via hole 25a of the double-sided printed circuit board 15a with a resin may be omitted. In the case where all the resin filling steps shown in FIG. 8 are omitted, the process can be simplified still more.

Second Embodiment

A method for manufacturing a semiconductor device according to a second embodiment of the present invention will be described below with reference to FIGS. 18 to 33. By sequentially performing the steps shown in FIGS. 18 to 33, the semiconductor device according to the second embodiment is completed.

Figure 18:
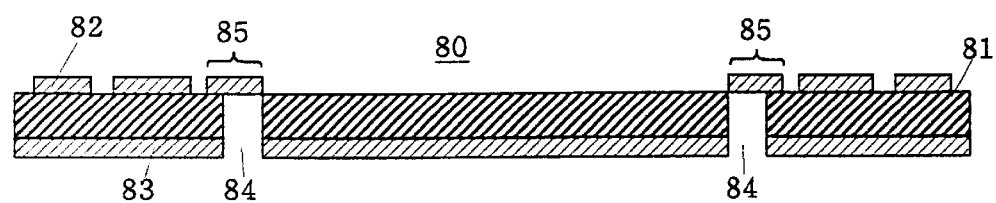
FIG. 18 is a sectional view showing a step in manufacturing a semiconductor device according to a second embodiment of the present invention.

After performing the same steps as the steps shown in FIGS. 1 to 4, a double-sided printed circuit board 80 shown in FIG. 18 is prepared. The double-sided printed circuit board 80 comprises an insulating substrate 81. A patterned copper foil 82 is formed on one of main surfaces of the insulating substrate 81. A copper foil 83 is formed on the other main surface of the insulating substrate 81. The copper foil 82 is left in a region 85 where a hole 84 is formed such that the hole 84 is covered. The hole 84 penetrates the copper foil 83 and the insulating substrate 81.

Figure 19:
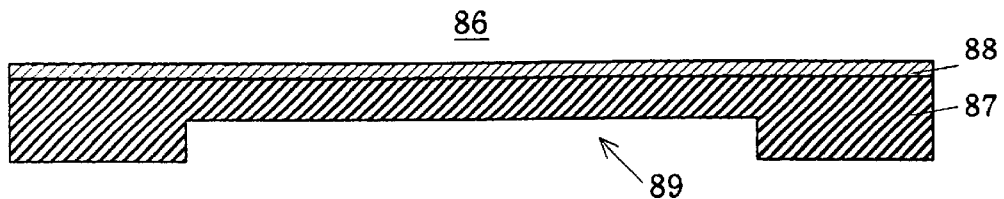
FIG. 19 is a sectional view showing a step in manufacturing the semiconductor device according to the second embodiment of the present invention.

As shown in FIG. 19, an insulating substrate 87 is formed. The insulating substrate 87 has a copper foil 88 formed on one of main surfaces of the substrate 87, and a concave portion 89 on the other main surface of the substrate.

Figure 20:
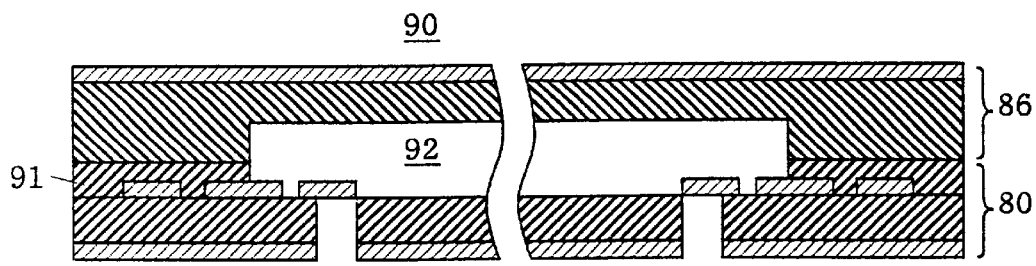
FIG. 20 is a sectional view showing a step in manufacturing the semiconductor device according to the second embodiment of the present invention.
Figure 21:
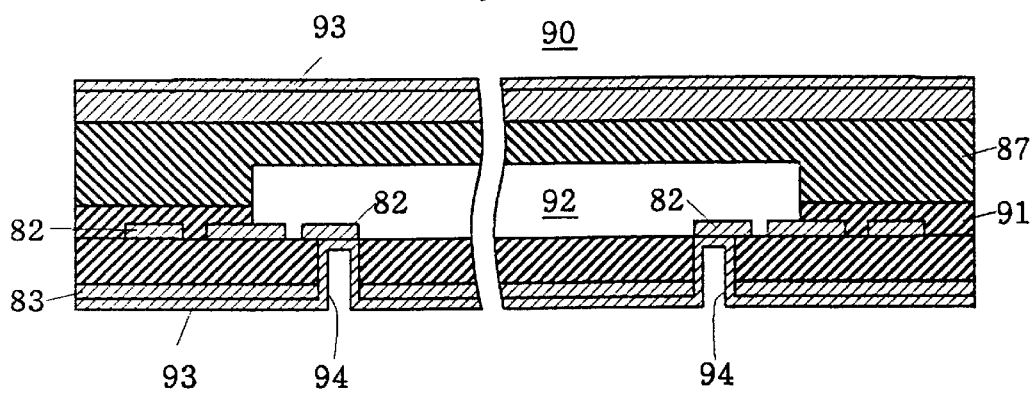
FIG. 21 is a sectional view showing a step in manufacturing the semiconductor device according to the second embodiment of the present invention.

One of the main surfaces of the double-sided printed circuit board 80 shown in FIG. 18 is bonded to the other main surface of the insulating substrate 87 shown in FIG. 19 by prepreg 91 so that a laminated printed circuit board 90 is formed (see FIG. 20). The laminated printed circuit board 90 is also a kind of laminated product comprising an insulating base, an insulating substrate and a copper foil. A chamber 92 is provided in the central portion of the laminated printed circuit board 90. The laminated printed circuit board 90 is plated with copper so that a copper plated layer 93 is formed on the copper foils 83 and 88. The copper plated layer 93 is formed on the hole 84. Consequently, an interstitial via hole 94 for connecting the copper foils 82 and 83 is formed (see FIG. 21). At this time, the hole 84 for an interstitial via hole is covered with the copper foil 82 as shown in FIG. 20. Therefore, a plating solution is prevented from invading the chamber 92.

Figure 22:
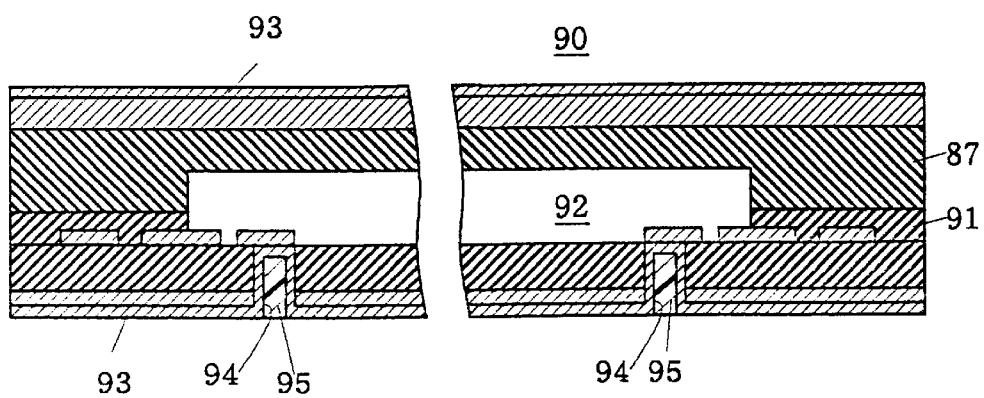
FIG. 22 is a sectional view showing a step in manufacturing the semiconductor device according to the second embodiment of the present invention.
Figure 23:
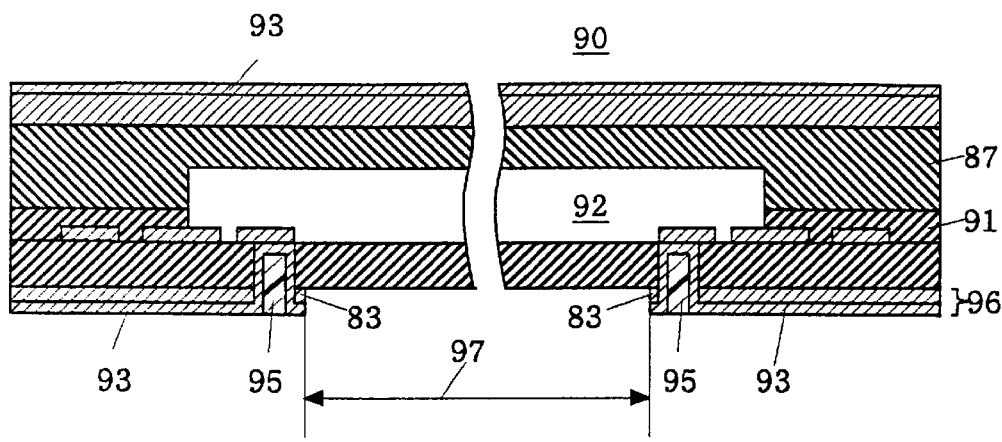
FIG. 23 is a sectional view showing a step in manufacturing the semiconductor device according to the second embodiment of the present invention.

As shown in FIG. 22, the interstitial via hole 94 is filled with a resin 95. A wiring layer 96 formed by the copper foil 83 and the copper plated layer 93 is patterned as shown in FIG. 23. At this time, the copper foil 83 and the copper plated layer 93 which are provided in a region 97 below the chamber 92 are removed simultaneously (see FIG. 24).

In the same manner as the double-sided printed circuit board 80 shown in FIG. 18, a double-sided printed circuit board 100 is prepared. The double-sided printed circuit board 100 comprises an insulating substrate 101. The insulating substrate 101 has a copper foil 102 patterned on one of its main surfaces, and a copper foil 103 formed on the other main surface. The copper foil 102 is left in a region 105 where a hole 104 is formed such that the hole 104 is covered. The hole 104 penetrates the copper foil 103 and the insulating substrate 101.

Figure 24:
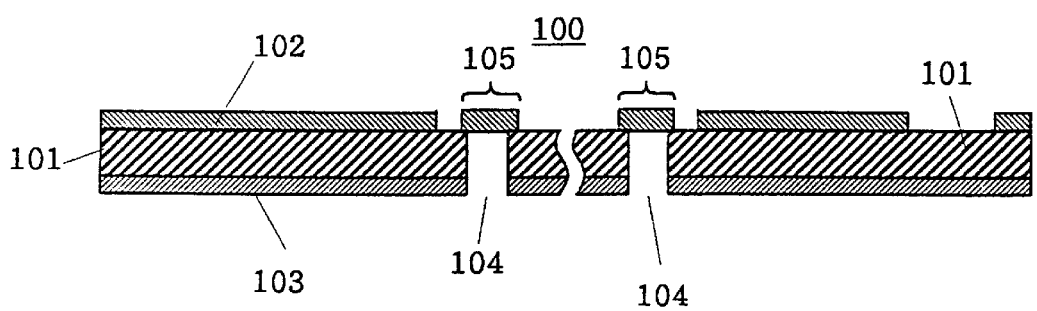
FIG. 24 is a sectional view showing a step in manufacturing the semiconductor device according to the second embodiment of the present invention.
Figure 25:
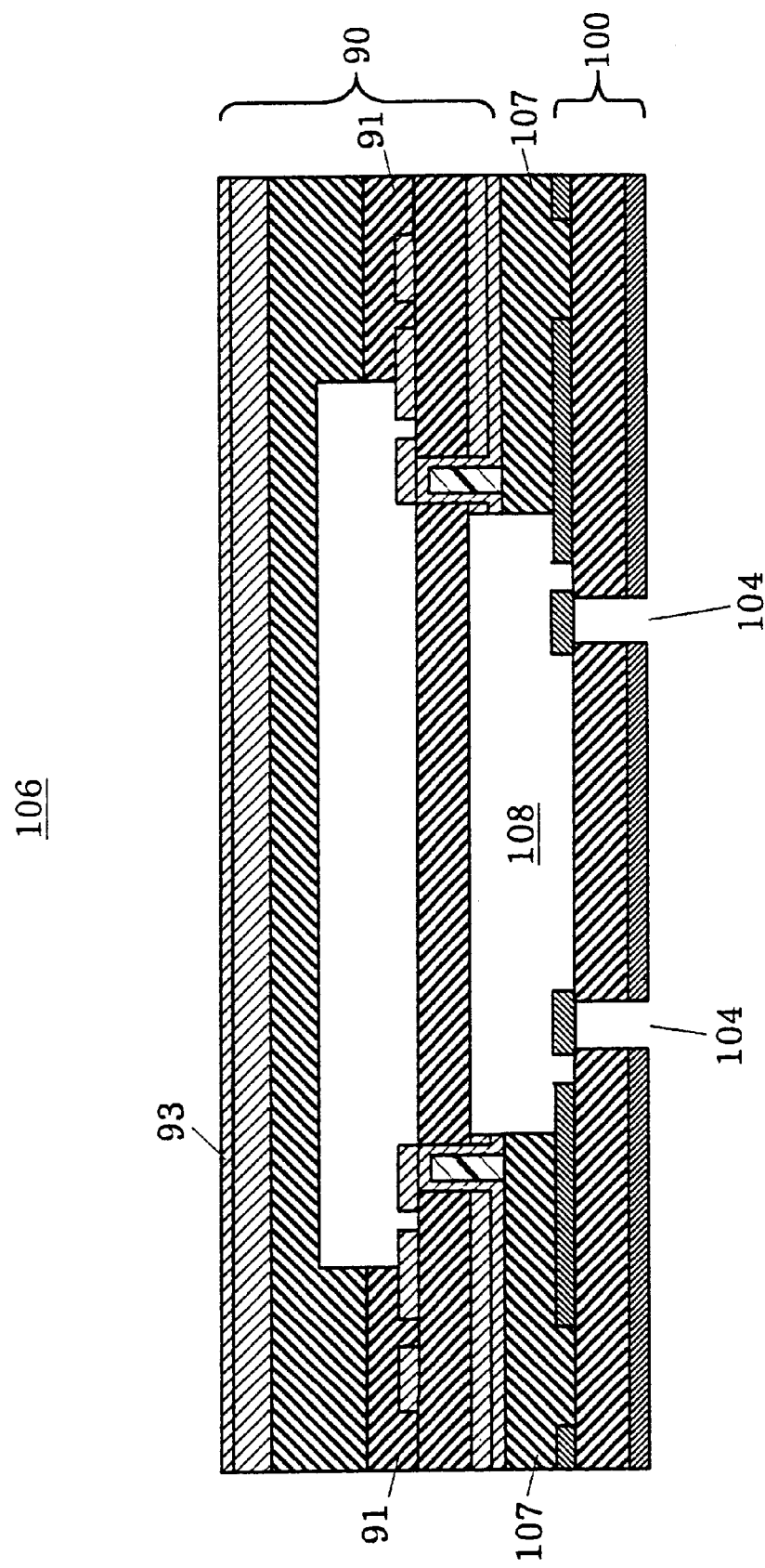
FIG. 25 is a sectional view showing a step in manufacturing the semiconductor device according to the second embodiment of the present invention.
Figure 26:
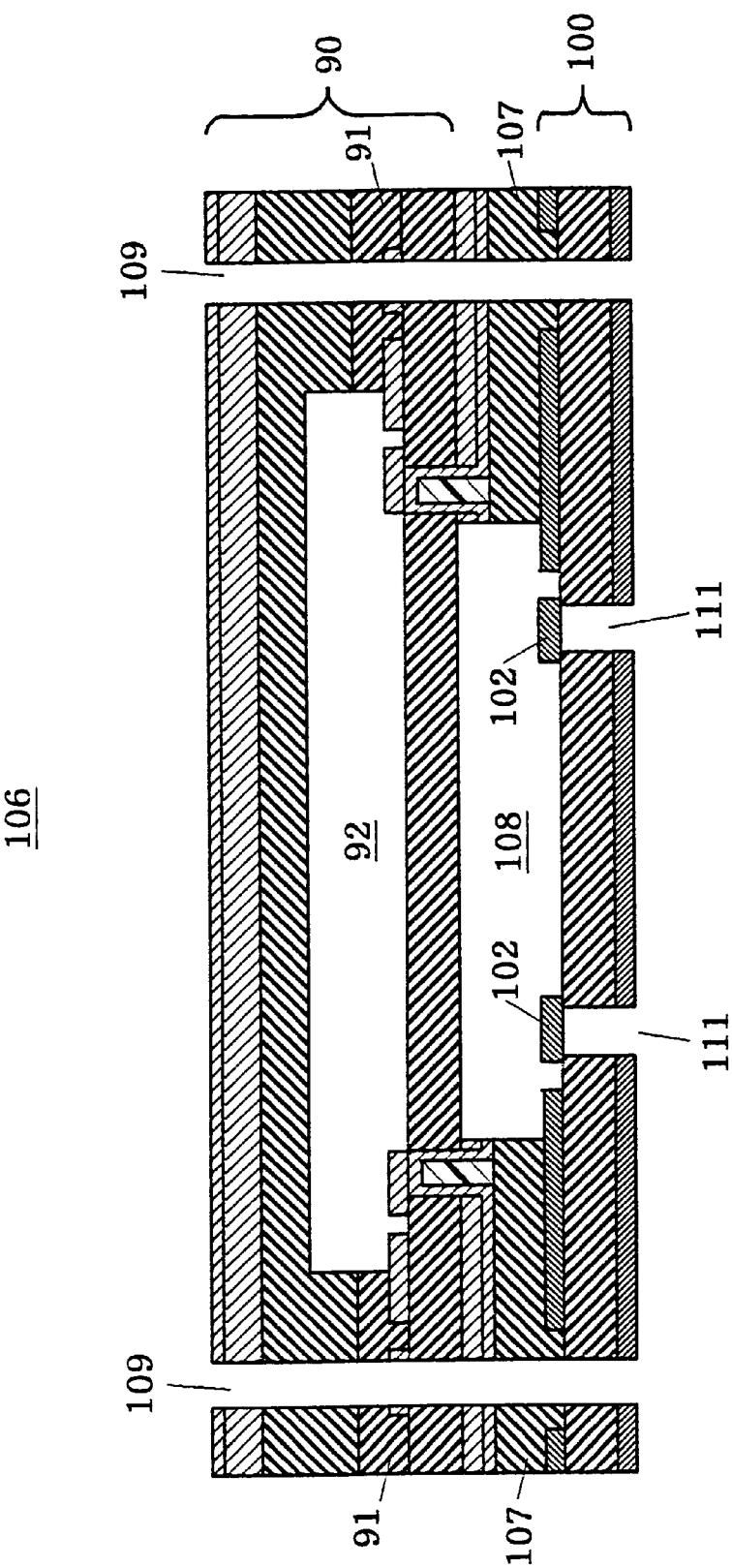
FIG. 26 is a sectional view showing a step in manufacturing the semiconductor device according to the second embodiment of the present invention.
Figure 27:
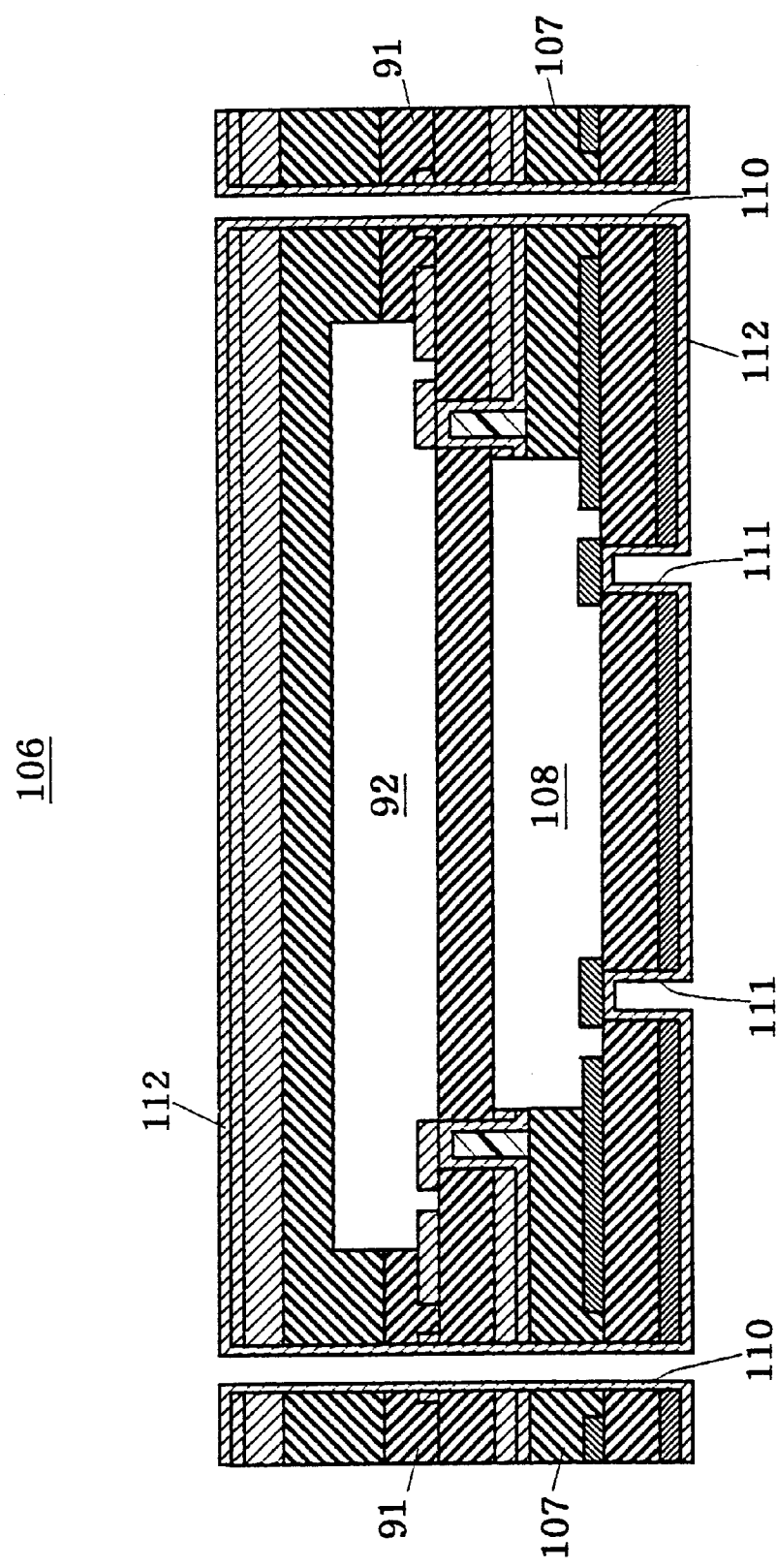
FIG. 27 is a sectional view showing a step in manufacturing the semiconductor device according to the second embodiment of the present invention.

One of the main surfaces of the double-sided printed circuit board 100 shown in FIG. 24 is bonded, by prepreg 107, to the other main surface side of the double-sided printed circuit board 80 forming the laminated printed circuit board 90 shown in FIG. 23. Thus, a laminated printed circuit board 106 is formed as an aggregate of the laminated printed circuit board 90 and the double-sided printed circuit board 100 (see FIG. 25). The prepreg 107 is not present in a chamber 108 forming a cavity between the double-sided printed circuit board 100 and the laminated printed circuit board 90 in the central portion of the laminated printed circuit board 106. A hole 109 which penetrates the laminated printed circuit board 106 is formed in regions of the laminated printed circuit board 106 where the prepregs 91 and 107 are present (see FIG. 26). Then the laminated printed circuit board 106 on which the hole 109 is formed is plated with copper so that a copper plated layer 112 is formed. Consequently, a through hole 110 and an interstitial via hole 111 are formed (see FIG. 27). At this step, the laminated printed circuit board 106 is immersed in a plating solution so as to be plated with copper. As shown in FIG. 26, however, the hole 104 for the interstitial via hole is covered with the copper foil 102 so that the chamber 108 is sealed. Accordingly, the plating solution can be prevented from invading the chambers 92 and 108.

Figure 28:
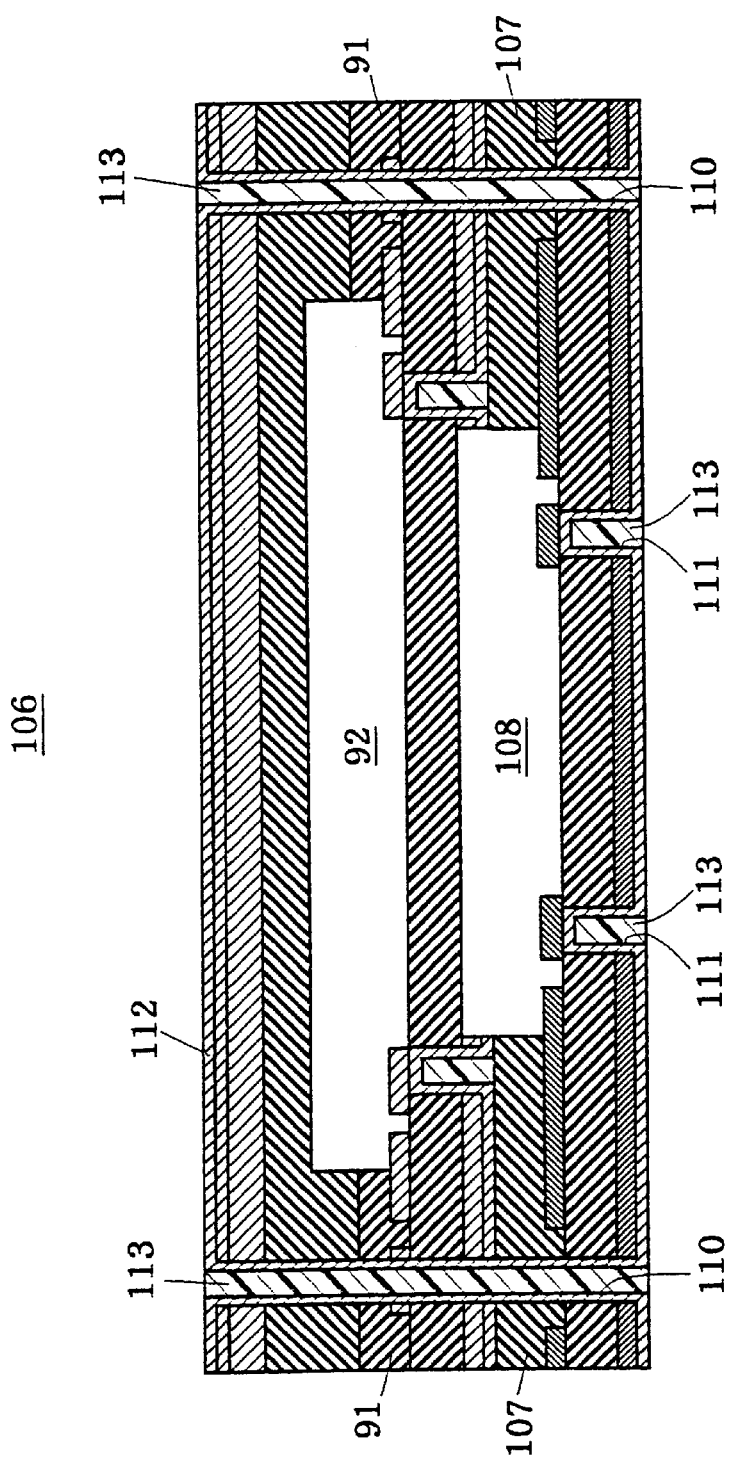
FIG. 28 is a sectional view showing a step in manufacturing the semiconductor device according to the second embodiment of the present invention.
Figure 29:
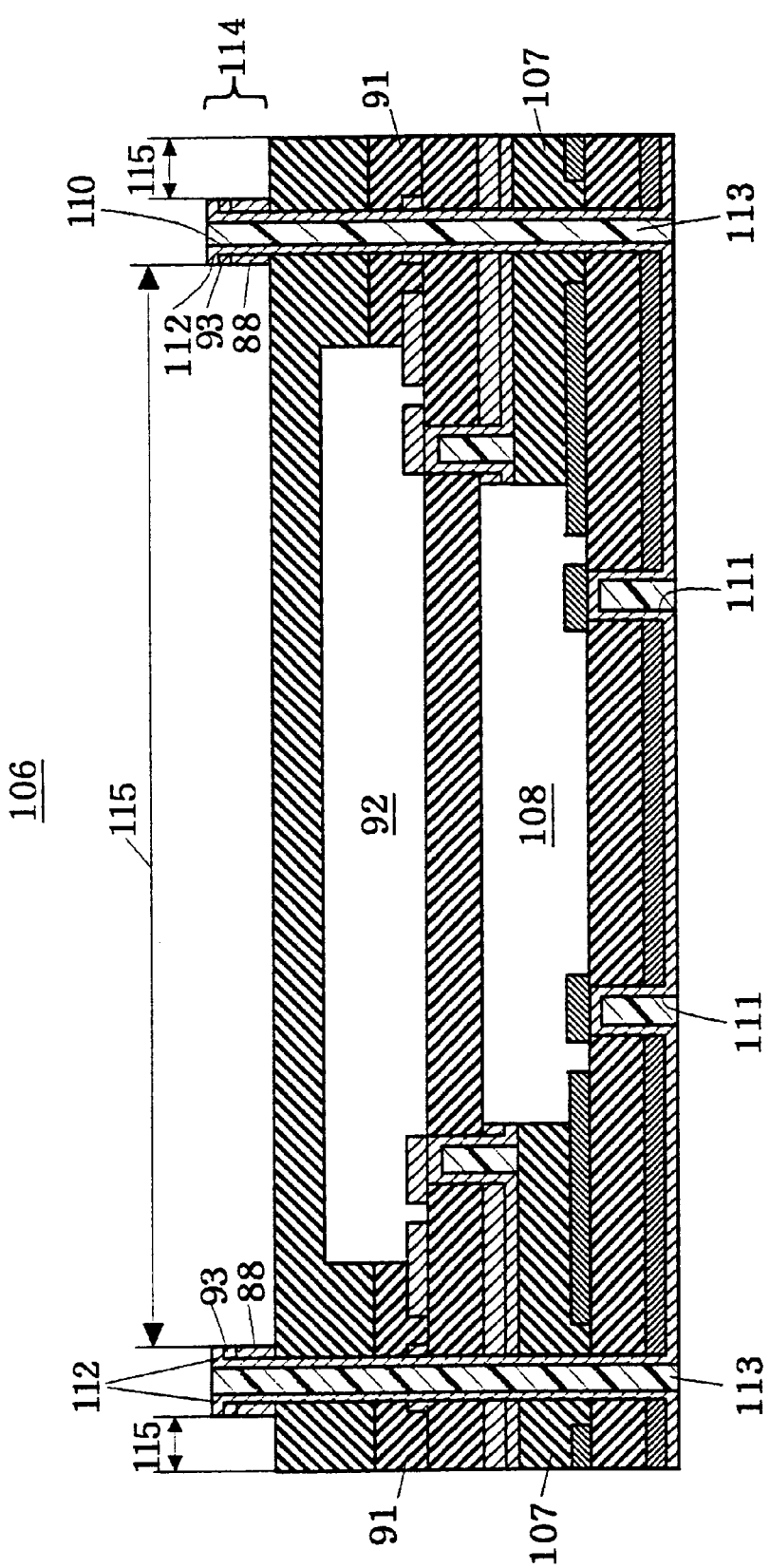
FIG. 29 is a sectional view showing a step in manufacturing the semiconductor device according to the second embodiment of the present invention.
Figure 30:
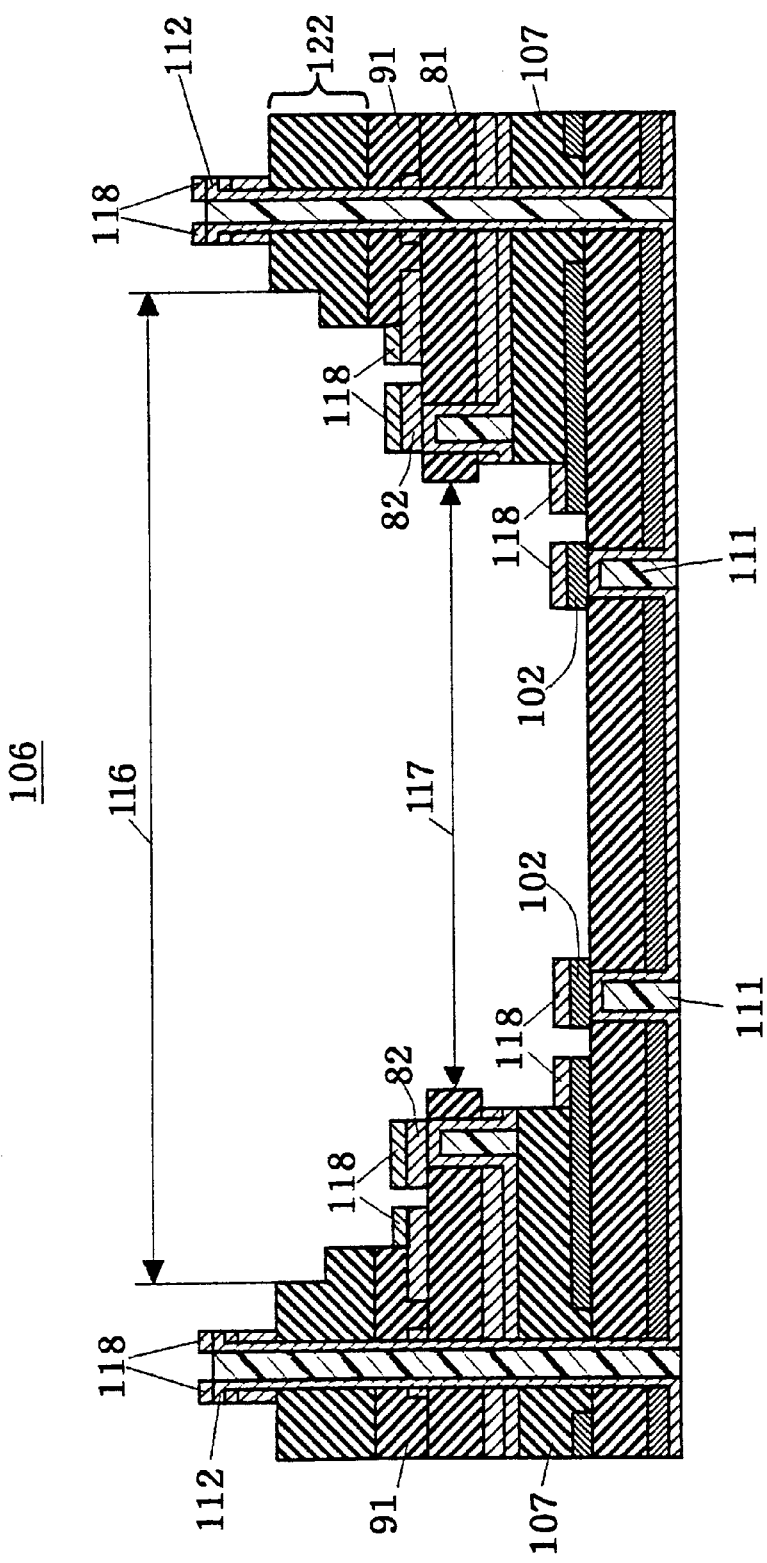
FIG. 30 is a sectional view showing a step in manufacturing the semiconductor device according to the second embodiment of the present invention.

As shown in FIG. 28, the through hole 110 and the interstitial via hole 111 are filled with a resin 113. Then, a wiring, layer 114 is patterned (see FIG. 29). In that case, the copper foil 88 and the copper plated layers 93 and 112 which are provided in a region 115 except for the through hole 110 and the surroundings thereof are also removed.

Milling is performed on an upper region 116. A cover supporting portion 122 is opened while a portion on which a cover should be fixed is being formed. Furthermore, an opening 117 is formed in the insulating substrate 81. After that, nickel-gold plating is performed so that a nickel-gold plated layer 118 is formed on the copper foils 82 and 102 and the copper plated layer 112 (see FIG. 30).

Figure 31:
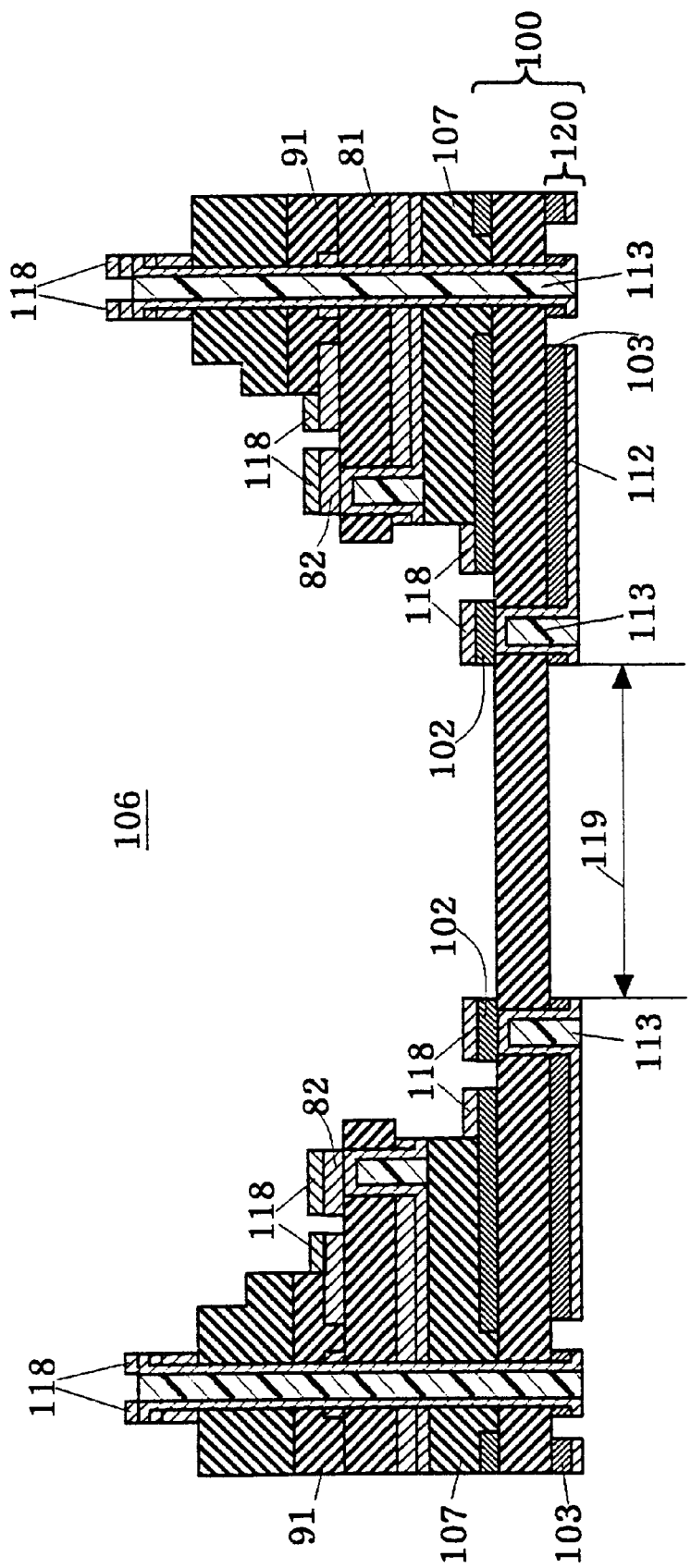
FIG. 31 is a sectional view showing a step in manufacturing the semiconductor device according to the second embodiment of the present invention.

As shown in FIG. 31, a wiring layer 120 is patterned on the other main surface side of the double-sided printed circuit board 100. In that case, the copper foil 103 and the copper plated layer 112 which are provided in a lower region 119 where a cavity is formed are removed. The patterned wiring layer 120 is formed by the copper foil 103 and the copper plated layer 112. The thickness of the wiring layer 120 is smaller, by the thickness of the copper plated layer 42, than that of the wiring layer 23 according to the prior art which is being patterned as shown in FIG. 55. Accordingly, it is easy to make the pattern of the wiring layer 120 finer.

Figure 32:
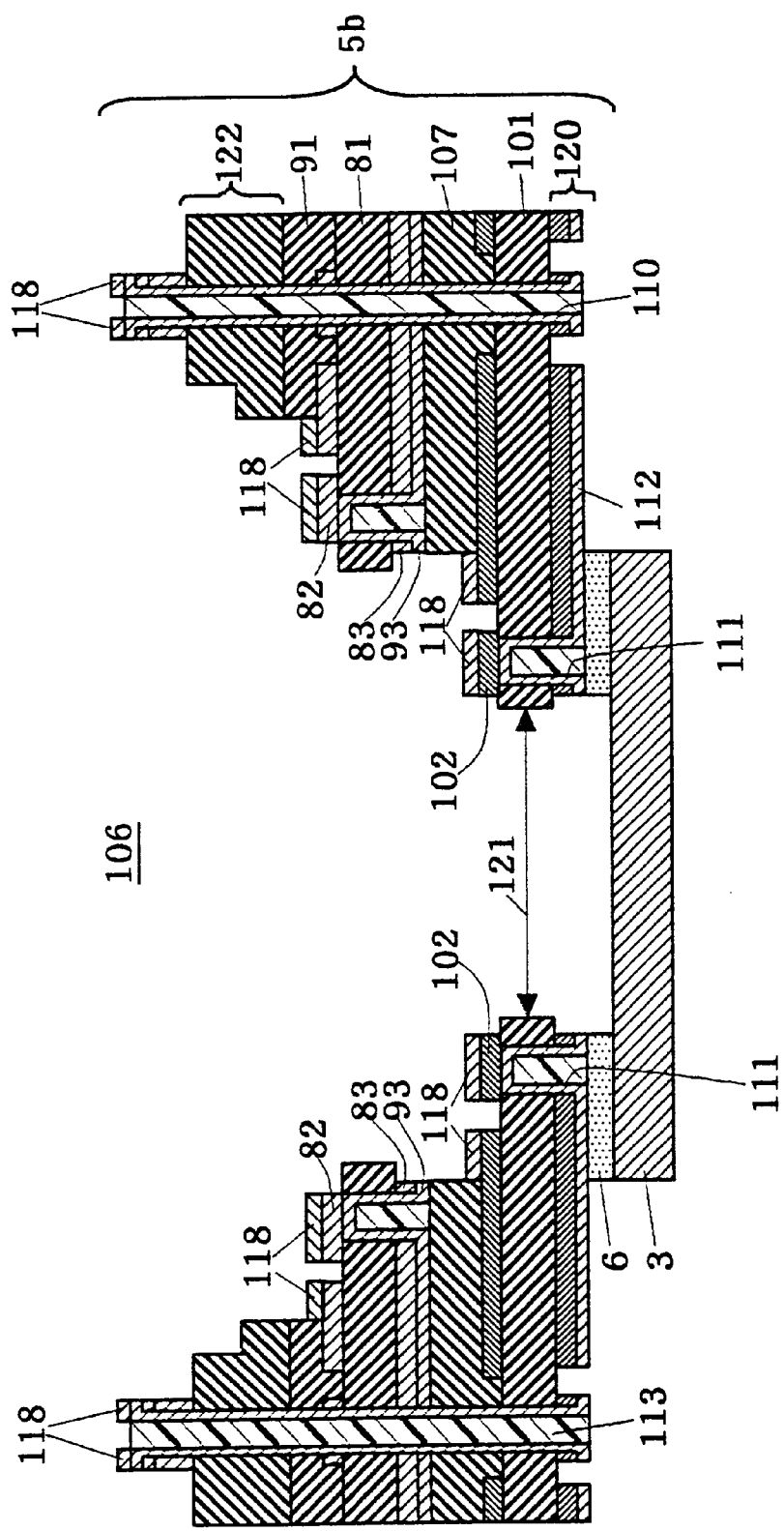
FIG. 32 is a sectional view showing a step in manufacturing the semiconductor device according to the second embodiment of the present invention.

As shown in FIG. 32, an opening 121 is formed in the lower region 119 so that a frame 5b is completed. A slug 3 is bonded to the frame 5b with an adhesive 6.

A chip 2 is bonded to the slug 3 with a die bonding resin 4, and is connected to the nickel-gold plated layer 118 by a wire 8. A cover 130 is mounted with a shielding resin 131 so that a package is sealed. Then, a solder ball 7 is formed on the nickel-gold plated layer 118 of the wiring layer 122. Thus, a semiconductor device 1b having a printed circuit board type BGA package is completed.

According to the above-mentioned process, copper plating can be performed to form the interstitial via hole 111 and the through hole 110 at the same time. Consequently, one of plating steps can be omitted unlike the prior art in which the interstitial via hole and the through hole are formed separately. For this reason, the manufacture of a printed circuit board type BGA package can be simplified.

An example in which the interstitial via holes 94 and 111 and the through hole 110 are completely filled with the resins 95 and 113 has been described in the second embodiment. The interstitial via hole 94 can be filled with the prepreg 107 when bonding the laminated printed circuit board 90 to the double-sided printed circuit board 100 with the prepreg 107. For this reason, it is not necessary to fill the interstitial via hole 94 with the resin 95. By omitting the step of filling the interstitial via hole 94 with the resin 95, the process of manufacturing the printed circuit board type BGA package can be simplified more.

If it is not necessary to wire bond to a conductor pattern formed on the interstitial via hole 111 and to coat with a solder resist, the step of filling the interstitial via hole 111 with the resin 113 may be omitted. If it is not necessary to coat the through hole 110 with the solder resist, the step of filling the through hole 110 with the resin 113 may be omitted. In the case where the resin filling step shown in FIG. 28 is omitted, the process of manufacturing the printed circuit board type BGA package can be simplified more. The manufacturing cost can be reduced by eliminating all the resin filling steps for the resins 95 and 113.

The copper foils 82 and 102 are never plated with copper before patterning. The copper foils 83 and 103 are plated with copper only once. For this reason the wiring layers 120 and 123 to 125 which are formed on both sides of the insulating substrates 81 and 101 of the frame 5b have smaller thicknesses than in the prior art. Consequently, the wiring layers 120 and 123 to 125 are suitable for the formation of a conductor pattern at a small pitch.

While the case in which two double-sided printed circuit boards 80 and 100 are laminated has been described in the second embodiment, it is possible to laminate more double-sided printed circuit boards by adding the following procedure. More specifically, the same double-sided printed circuit board 80 as the double-sided printed circuit board 80 shown in FIG. 18 is prepared and bonded to the double-sided printed circuit board 80 as shown in FIGS. 20 to 23 before the step of FIG. 25. Then, the same steps are repeated. Thereafter, a further double-sided printed circuit board is prepared and the same steps are repeated. A method for manufacturing a printed circuit board type BGA package having such a structure has the same effects as those of a method for manufacturing a printed circuit board type BGA package having the structure obtained at the manufacturing steps according to the second embodiment.

Third Embodiment

A semiconductor device and a method for manufacturing the semiconductor device according to a third embodiment of the present invention will be described below with reference to FIGS. 34 to 36.

Figure 34:
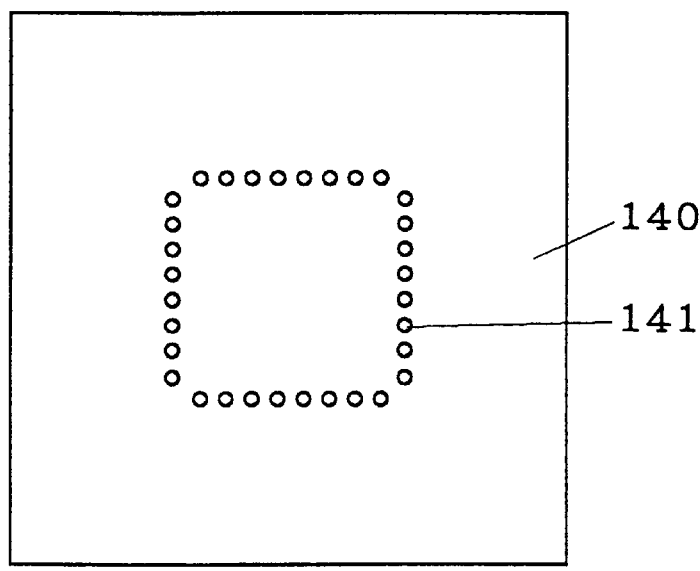
FIG. 34 is a plan view for explaining a semiconductor device according to a third embodiment of the present invention.
Figure 35:
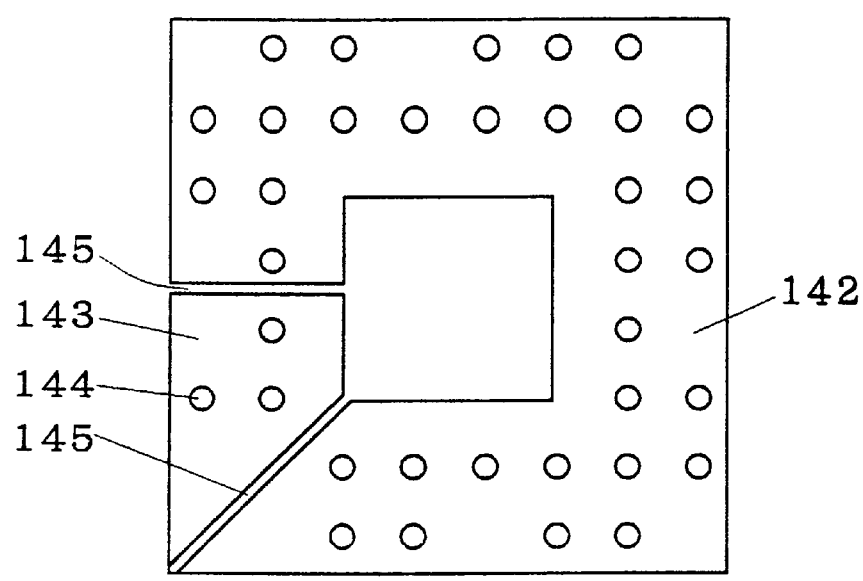
FIG. 35 is a plan view for explaining the semiconductor device according to the third embodiment of the present invention.

FIGS. 34 and 35 are plan views showing the structure of the copper foil obtained at the step shown in FIG. 4 according to the first embodiment. A copper foil 140 shown in FIG. 34 corresponds to the copper foil 30 shown in FIG. 4. Copper foils 142 and 143 shown in FIG. 35 correspond to the copper foil 31a shown in FIG. 4.

By way of example, it can also be seen that FIGS. 34 and 35 are plan views showing the structure of the copper foil obtained at the step shown in FIG. 18 according to the second embodiment. In this case, the copper foil 140 shown in FIG. 34 corresponds to the copper foil 82 shown in FIG. 18. The copper foils 142 and 143 shown in FIG. 35 correspond to the copper foil 83 shown in FIG. 18.

The copper foil 140 shown in FIG. 34 comprises a circular hole 141 for an interstitial via hole. A source voltage VDD and a grounding voltage GND are given to the copper foils 142 and 143 shown in FIG. 35. For this reason, an aperture 145 is provided between the copper foils 142 and 143 so as to insulate them from each order. Furthermore, an opening 144 is provided to selectively connect the copper foils 142 and 143 to through holes or the like.

However, when the copper foils 140 and 142 are connected by a plurality of small interstitial via holes, the inductance of the interstitial via holes is increased.

Figure 36:
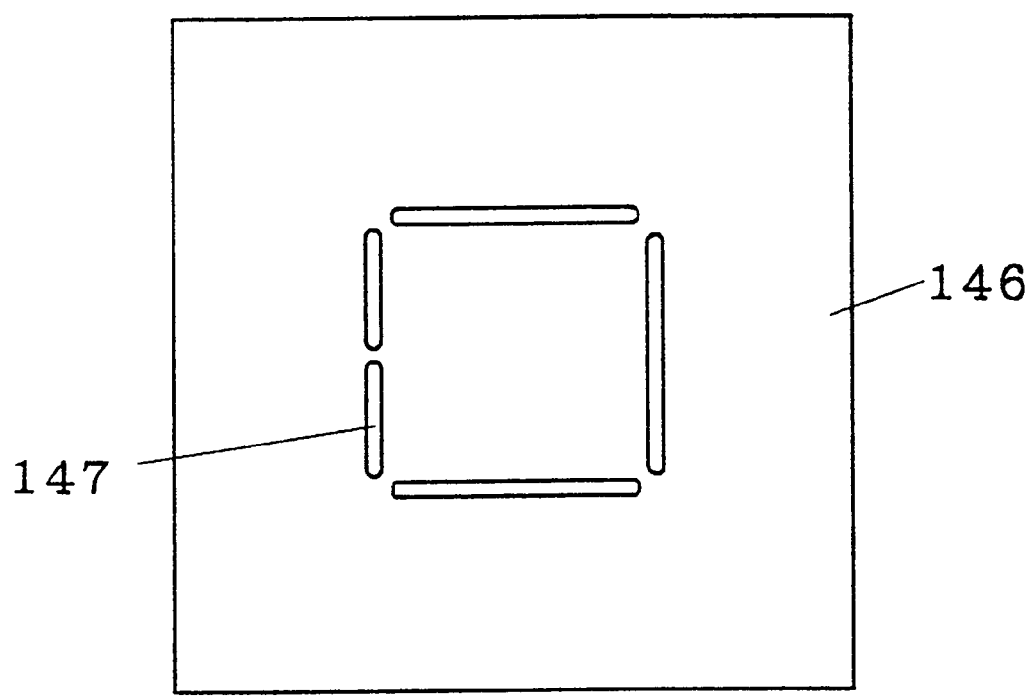
FIG. 36 is a plan view showing the structure of the semiconductor device according to the third embodiment of the present invention.

In the semiconductor device according to the first embodiment, the step of forming the hole 60 for the interstitial via hole shown in FIG. 2 is replaced with a step of forming a hole 147 for a slit-shaped interstitial via hole on the periphery of a portion which houses the semiconductor chip 2 as shown in FIG. 36. Consequently, a printed circuit board type BGA having the slit-shaped interstitial via hole can be manufactured. Thus, if the interstitial via hole is slit-shaped, the inductance of the interstitial via hole can be decreased.

In the case where the slit-shaped interstitial via hole is provided on the double-sided printed circuit board 15a or 16a shown in FIG. 4 or 5 in the same manner and the wiring layer 20a or 23a is a power source plane or ground plane, the inductance of the power source or ground can be reduced more.

In the semiconductor device according to the second embodiment, the step of preparing the double-sided printed circuit board 80 having the hole 84 for the interstitial via hole shown in FIG. 18 is replaced with the step of forming a hole 147 for a slit-shaped interstitial via hole on the periphery of a portion which houses the semiconductor chip 2 as shown in FIG. 36. Consequently, a printed circuit board type BGA having the slit-shaped interstitial via hole can be manufactured.

Figure 33:
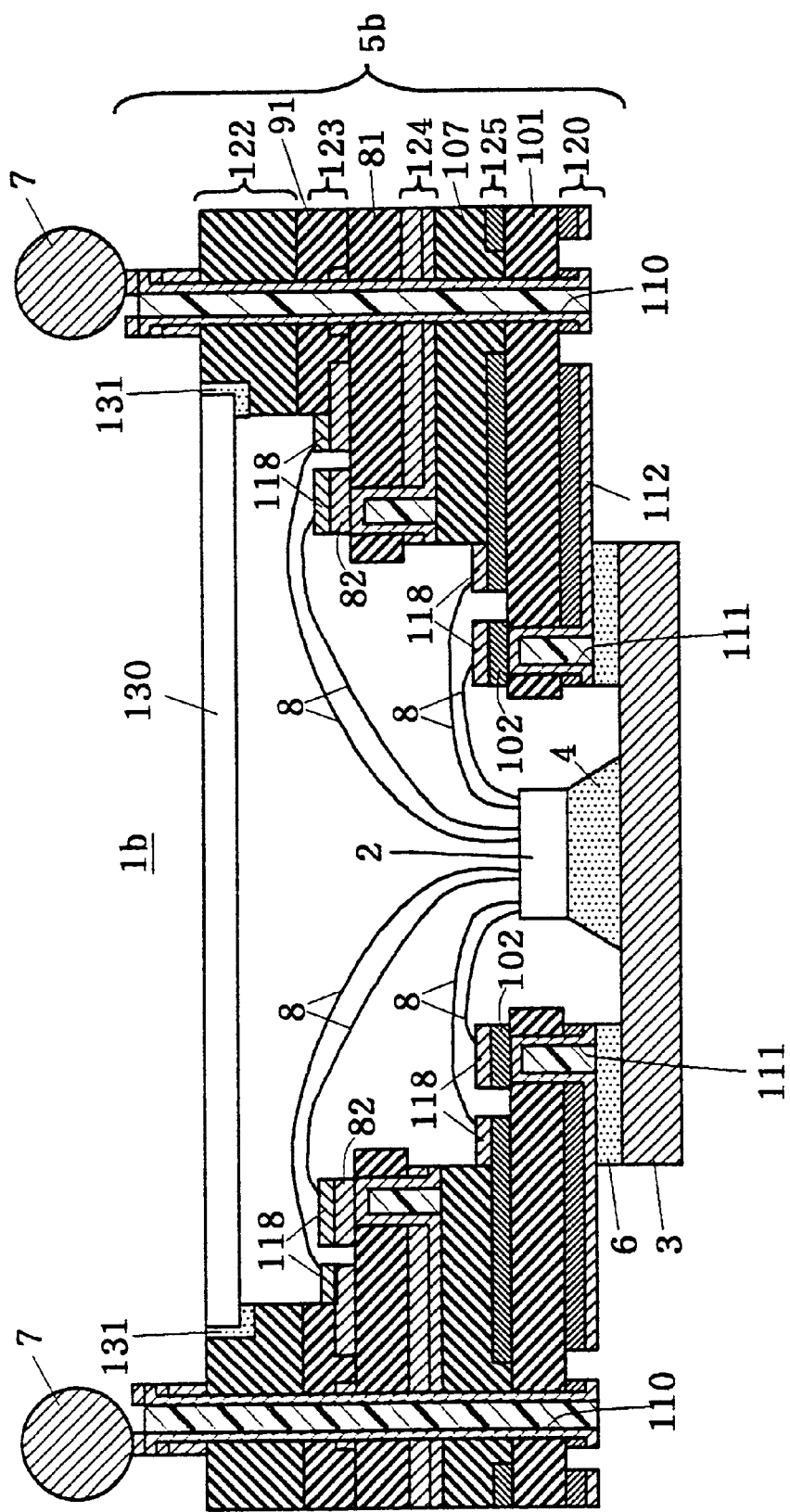
FIG. 33 is a sectional view showing a step in manufacturing the semiconductor device according to the second embodiment of the present invention.

In the case where the interstitial via hole formed on the insulating substrate 81 or 101 shown in FIG. 33 is slit-shaped and the wiring layer 120 or 124 is a power source plane or ground plane, it is possible to obtain a structure having excellent electrical characteristics in which the inductance of the power source or ground can be reduced more.

Fourth Embodiment

Figure 37:
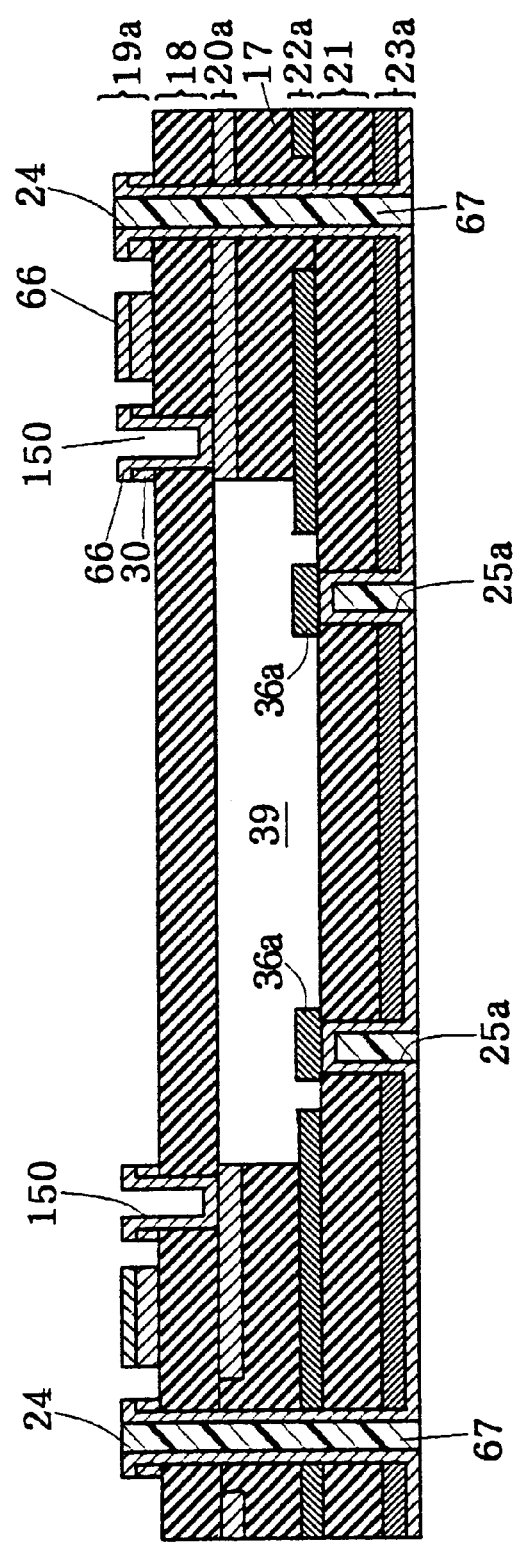
FIG. 37 is a sectional view showing a step in manufacturing a semiconductor device according to a fourth embodiment of the present invention.

A method for manufacturing a semiconductor device according to a fourth embodiment of the present invention will be described below with reference to FIGS. 37 to 39. In FIG. 37, the reference numeral 38b designates a laminated printed circuit board, the reference numeral 150 designates a slit-shaped interstitial via hole formed on an insulating substrate 18, and the same reference numerals designate the same portions as in FIG. 10. The slit-shaped interstitial via hole 150 can be formed as described in the fourth embodiment. The laminated printed circuit board 38b shown in FIG. 37 is prepared. For example, the interstitial via hole 150 shown in FIG. 37 is similar to the slit-shaped interstitial via hole 147 shown in FIG. 36.

Then, an opening 45a is formed on the upper portion of the laminated printed circuit board 38b by milling. Each end of the opening 45a is formed by scraping off one of side walls of the interstitial via hole 150. Accordingly, the bottom and the other side wall of the interstitial via hole 150 remain after the opening 45a is formed. Thereafter, the other side wall and the conductor pattern of a wiring layer 19a which extends to the other side wall are scraped off by means of an end mill or the like such that the bottom of the interstitial via hole 150 remains.

Figure 38:
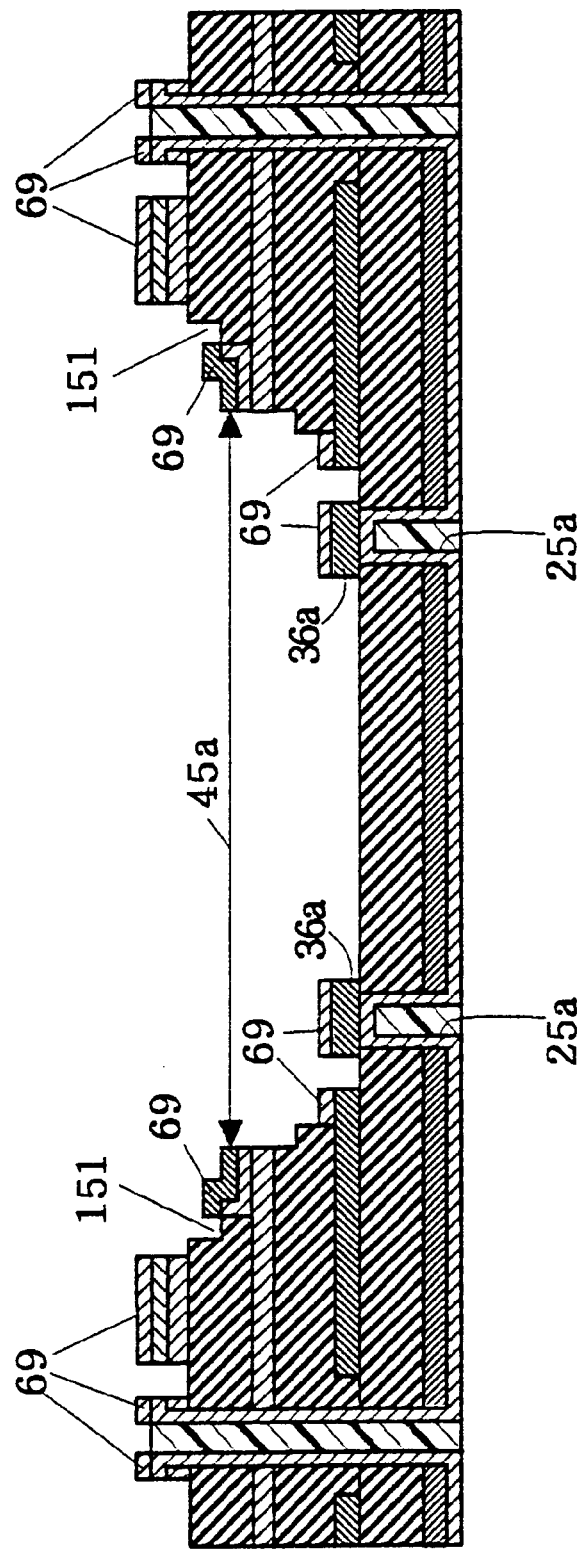
FIG. 38 is a sectional view showing a step in manufacturing the semiconductor device according to the fourth embodiment of the present invention.

A nickel-gold plated layer 69 is formed also on the bottom of the via hole (see FIG. 38). The bottom of the via hole is used as a wire bonding pad of a wiring layer 20a. Because the interstitial via hole 150 has a bottom, the interstitial via hole 150 can be used as the pad by performing the machining. FIG. 39 shows a section of the semiconductor device in which a wire 8 is connected by using the bottom as the wire bonding pad. Furthermore, the bottom can be used as the wire bonding pad because the interstitial via hole 150 is slit-shaped.

Figure 39:
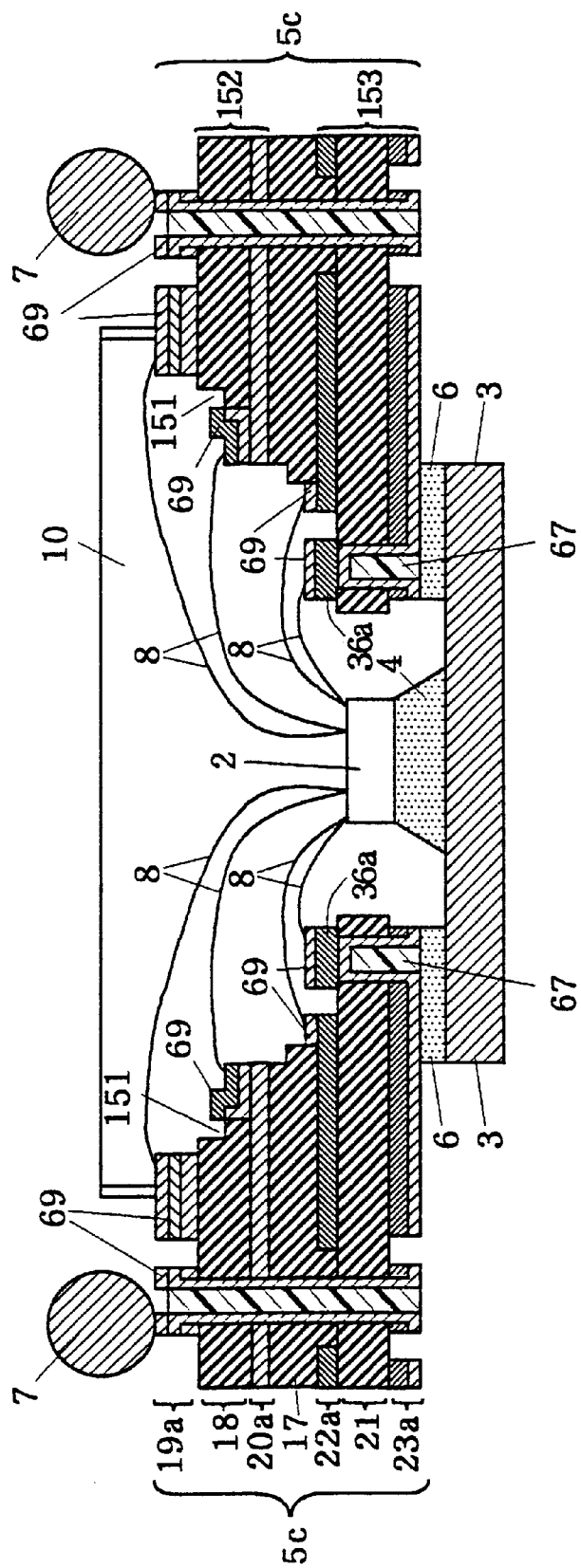
FIG. 39 is a sectional view showing a step in manufacturing the semiconductor device according to the fourth embodiment of the present invention.

As seen from a comparison between the sections of the semiconductor devices shown in FIGS. 39 and 14, space between the wires 8 connected to the wiring layers 19a and 20a can be increased in the direction of the thickness of the semiconductor device so that the short-circuit of the wires 8 can be prevented.

Fifth Embodiment

Figure 40:
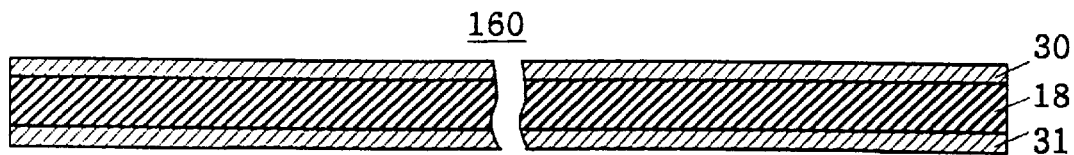
FIG. 40 is a sectional view showing a step in manufacturing a semiconductor device according to a fifth embodiment of the present invention.
Figure 41:
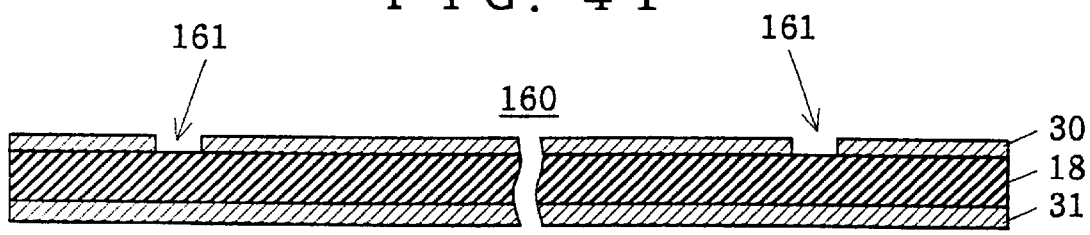
FIG. 41 is a sectional view showing a step in manufacturing the semiconductor device according to the fifth embodiment of the present invention.
Figure 42:
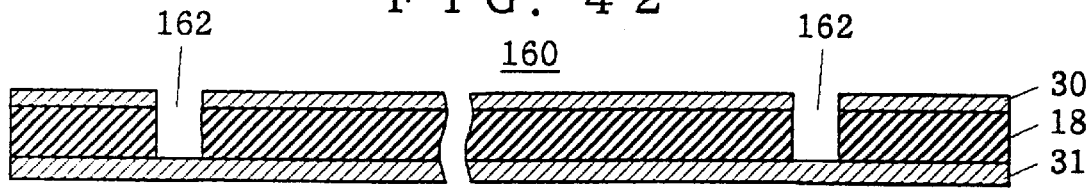
FIG. 42 is a sectional view showing a step in manufacturing the semiconductor device according to the fifth embodiment of the present invention.
Figure 43:
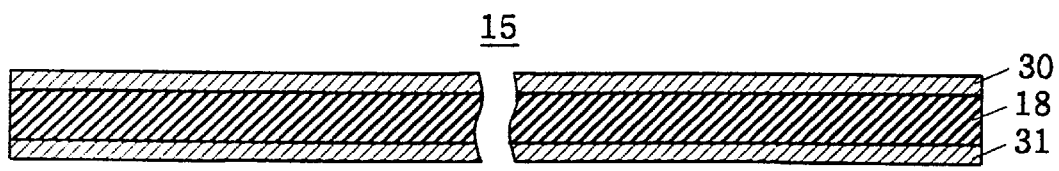
FIG. 43 is a sectional view showing a step in manufacturing a semiconductor device according to the prior art.
Figure 44:
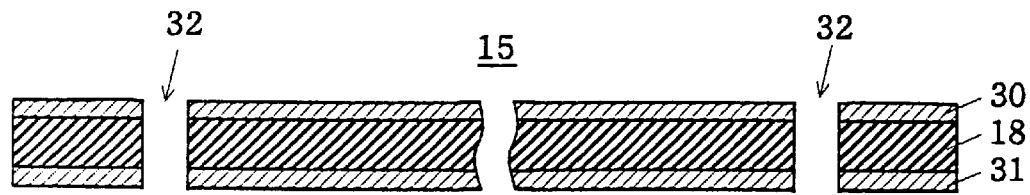
FIG. 44 is a sectional view showing a step in manufacturing the semiconductor device according to the prior art.
Figure 45:
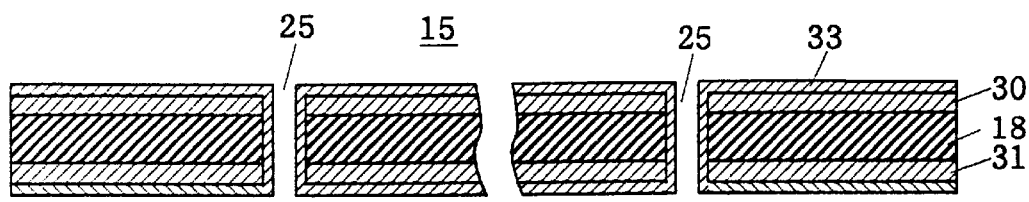
FIG. 45 is a sectional view showing a step in manufacturing the semiconductor device according to the prior art.
Figure 46:
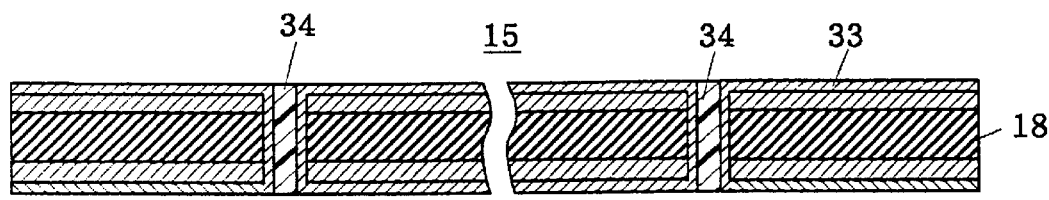
FIG. 46 is a sectional view showing a step in manufacturing the semiconductor device according to the prior art.

A method for manufacturing a semiconductor device according to a fifth embodiment of the present invention will be described below with reference to FIGS. 40 to 42. The steps shown in FIGS. 40 to 42 are substituted for the steps shown in FIGS. 1 to 3 according to the first embodiment. First of all, a double-sided printed circuit board 160 is prepared as shown in FIG. 40. Then, a copper foil 30 provided on one of sides is patterned. Consequently, the copper foil 30 is removed in a region 161 where a hole for an interstitial via hole is formed (see FIG. 41). As shown in FIG. 42, laser beams irradiated from the copper foil 30 side to form a hole 162 for the interstitial via hole.

Thus, the hole 162 for the interstitial via hole is formed so that the step of laminating a copper foil 31 and that of laminating the copper foil 30 can be performed at the same time.

While an example in which a part of the steps of manufacturing a semiconductor device according to the first embodiment is replaced has been described in the fifth embodiment, the steps according to the fifth embodiment can also be used for the second embodiment so that the same effects can be obtained.

While examples in which the copper foil is used have been described in the above-mentioned embodiments, other metallic foils may be used such that the same effects can be obtained.

While the invention has been described in detail, the foregoing description is in all aspects illustrative and not restrictive. It is understood that numerous other modifications and variations can be devised without departing from the scope of the invention.

What is claimed is:

1. A method for manufacturing a semiconductor device comprising:

preparing a first printed circuit board including an insulating substrate, a first metallic foil disposed on a first main surface of said insulating substrate, a second metallic foil disposed on a second main surface of said insulating substrate, and a first hole, the first hole penetrating through said first metallic foil and said insulating substrate, reaching said second metallic foil, and being closed by said second metallic foil;

patterning said second metallic foil without removing a region of said second metallic foil covering the first hole;

bonding a member to said second metallic foil with a bonding material selectively interposed between said member and said first printed circuit board to form a sealed empty chamber between said first printed circuit board and said member, said member being opposite said region of said second metallic foil covering the first hole;

plating said insulating substrate in the first hole to form a first conductive path electrically connecting said first and second metallic foils; and forming an opening in said member, exposing the chamber after forming said first conductive path.

2. The method for manufacturing a semiconductor device as defined in claim 1, wherein preparing said first printed circuit board comprises:

forming said first metallic foil on said first main surface of said insulating substrate;

forming the first hole which penetrates said insulating substrate and said first metallic foil; and laminating said second metallic foil on said second main surface of said insulating substrate.

3. The method of manufacturing a semiconductor device as defined in claim 1, wherein preparing said first printed circuit board comprises:

preparing said insulating substrate including said first and second metallic foils;

patterning said first metallic foil in a region where the first hole is to be formed; and irradiating the patterned first metallic foil with laser beams to form the first hole penetrating through said insulating substrate.

4. The method for manufacturing a semiconductor device as defined in claim 1, wherein said member is a laminated product comprising a first main surface bonded to said second metallic foil and a second main surface, a third metallic foil forming said second main surface of said laminated product, the method comprising:

forming a second hole penetrating said member from said third metallic foil and penetrating said first printed circuit board, including said first metallic foil, but not penetrating into the sealed empty chamber, before forming said first conductive path; and simultaneously forming said first conductive path and a second conductive path electrically connecting said third metallic foil to said first metallic foil.

5. The method for manufacturing a semiconductor device as defined in claim 4, wherein said laminated product includes a second insulating substrate having a first main surface on which said third metallic foil is disposed, a second main surface, and a fourth metallic foil disposed on said second main surface of said second insulating substrate, the method comprising forming a third hole penetrating said third metallic foil, said second insulating substrate, and reaching but not penetrating said fourth metallic foil, before forming said first conductive path.

6. The method for manufacturing a semiconductor device as defined in claim 4, including forming said laminated product by:

preparing an insulating base having said third metallic foil on a first main surface of said insulating base and a concave portion in a second main surface of said insulating base, and a second printed circuit board having a fourth metallic foil on a first main surface of said second printed circuit board, a fifth metallic foil on a second main surface of said second printed circuit board, and a third hole in said second printed circuit board, the third hole penetrating said fourth metallic foil and reaching said fifth metallic foil and being closed by said fifth metallic foil;

patterning said fifth metallic foil without removing a region covering the third hole;

bonding said second main surface of said insulating base to the second main surface of said second printed circuit board; and plating said second printed circuit board in the third hole to form a conductive path electrically connecting said fourth and fifth metallic foils.

7. The method for manufacturing a semiconductor device as defined in claim 1, wherein the first hole is slit-shaped.

8. The method for manufacturing a semiconductor device as defined in claim 7, wherein forming an opening comprises:

machining and moving an inner wall of the slit-shaped first hole without removing an outer wall of the slit-shaped first hole to expose a bottom section of the slit-shaped first hole;

machining and removing an upper portion of the outer wall of the slit-shaped first hole; and forming a pad on the bottom of the slit-shaped first hole.

* * * * *